United States Patent
Kim et al.

(10) Patent No.: US 8,420,289 B2
(45) Date of Patent: Apr. 16, 2013

(54) AROMATIC RING-CONTAINING POLYMER, POLYMER MIXTURE, ANTIREFLECTIVE HARDMASK COMPOSITION, AND ASSOCIATED METHODS

(75) Inventors: Min Soo Kim, Incheon (KR); Dong Seon Uh, Seoul (KR); Chang Il Oh, Gyeonggi-do (KR); Kyong Ho Yoon, Daejeon (KR); Kyung Hee Hyung, Gteonggi-do (KR); Jin Kuk Lee, Gyeonggi-do (KR); Jong-Seob Kim, Daejeon (KR); Hwan Sung Cheon, Seoul (KR); Irina Nam, Gyeonggi-do (KR); Nataliya Tokareva, Gyeonggi-do (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 511 days.

(21) Appl. No.: 12/588,023

(22) Filed: Oct. 1, 2009

(65) Prior Publication Data
US 2010/0021830 A1    Jan. 28, 2010

Related U.S. Application Data

(63) Continuation-in-part of application No. PCT/KR2007/007058, filed on Dec. 31, 2007.

(30) Foreign Application Priority Data

Apr. 2, 2007  (KR) .................. 10-2007-0032591
May 25, 2007  (KR) .................. 10-2007-0051074
Jun. 5, 2007  (KR) .................. 10-2007-0055241

(51) Int. Cl.
G03F 7/00 (2006.01)
G03F 7/004 (2006.01)
G03F 7/40 (2006.01)
G03F 7/11 (2006.01)
G03F 7/028 (2006.01)

(52) U.S. Cl.
USPC ............... 430/270.1; 430/271.1; 430/913; 430/905; 430/927; 430/330; 430/331

(58) Field of Classification Search ............ 430/270.1, 430/271.1, 272.1, 905, 913, 330, 331
See application file for complete search history.

(56) References Cited

U.S. PATENT DOCUMENTS

| | | | |
|---|---|---|---|
| 5,059,708 A | 10/1991 | Aruga et al. | |
| 5,268,246 A | 12/1993 | Aruga et al. | |
| 5,569,800 A | 10/1996 | Aruga et al. | |
| 7,223,517 B2 | 5/2007 | Babich et al. | |
| 7,981,594 B2 * | 7/2011 | Yoon et al. | 430/323 |
| 2006/0154107 A1 | 7/2006 | Kubota et al. | |
| 2006/0234158 A1 | 10/2006 | Hatakeyama | |

FOREIGN PATENT DOCUMENTS

| | | |
|---|---|---|
| JP | 04-117349 A | 4/1992 |
| JP | 07-089884 A | 4/1995 |
| JP | 09-325498 A | 12/1997 |
| JP | 2005-055893 A | 3/2005 |
| KR | 10-0671120 B1 | 1/2007 |

(Continued)

*Primary Examiner* — Amanda C. Walke
(74) *Attorney, Agent, or Firm* — Lee & Morse, P.C.

(57) ABSTRACT

An aromatic ring-containing polymer, a polymer mixture, an antireflective hardmask composition, and a method for patterning a material on a substrate, the aromatic ring-containing polymer including at least one aromatic ring-containing polymer represented by Formulae 1, 2, or 3.

17 Claims, 9 Drawing Sheets

(Formula 1)

FOREIGN PATENT DOCUMENTS

| | | |
|---|---|---|
| WO | WO 01/63358 A1 | 8/2001 |
| WO | WO 2005/115950 A1 | 12/2005 |
| WO | 2006/126776 A1 | 11/2006 |
| WO | WO 2008150058 A1 * | 12/2008 |

* cited by examiner

FIG. 1

TABLE 1: Sample used and Optical properties.

| Sample used in the formation of film | Optical properties (193 nm) | | Optical properties (248 nm) | |
|---|---|---|---|---|
| | Refractive index (n) | Extinction coefficient (k) | Refractive index (n) | Extinction coefficient (k) |
| Comparative Example 1 | 1.44 | 0.70 | 1.97 | 0.27 |
| Example 1 | 1.43 | 0.61 | 2.29 | 0.65 |
| Example 2 | 1.31 | 0.31 | 2.09 | 0.79 |
| Example 3 | 1.36 | 0.49 | 2.18 | 0.70 |
| Example 4 | 1.43 | 0.61 | 2.29 | 0.65 |
| Example 5 | 1.31 | 0.31 | 2.09 | 0.79 |
| Example 6 | 1.36 | 0.49 | 2.18 | 0.70 |
| Example 7 | 1.50 | 0.71 | 1.74 | 0.53 |
| Example 8 | 1.49 | 0.71 | 1.68 | 0.67 |
| Example 9 | 1.49 | 0.70 | 1.70 | 0.60 |
| Example 10 | 1.45 | 0.67 | 1.79 | 0.53 |
| Example 11 | 1.44 | 0.66 | 2.14 | 0.46 |

FIG. 2

TABLE 2: Sample used and Pattern properties.

| Sample used in the formation of film | Pattern properties | | |
|---|---|---|---|
| | EL margin (Δ mJ/exposure energy mJ) | DoF margin (μm) | Profile |
| Comparative Example 2 | 0.1 | 0.1 | undercut |
| Example 12 | 0.3 | 0.3 | cubic |
| Example 13 | 0.3 | 0.3 | cubic |
| Example 14 | 0.3 | 0.3 | cubic |
| Example 15 | 0.3 | 0.3 | cubic |
| Example 16 | 0.3 | 0.3 | cubic |
| Example 17 | 0.3 | 0.3 | cubic |
| Example 18 | 0.3 | 0.3 | cubic |
| Example 19 | 0.3 | 0.3 | cubic |
| Example 20 | 0.3 | 0.3 | cubic |
| Example 21 | 0.3 | 0.3 | cubic |
| Example 22 | 0.3 | 0.3 | cubic |

FIG. 3

TABLE 3: Sample used and Pattern shape after etching.

| Sample used in the formation of film | Pattern shape after etching |
|---|---|
| Comparative Example 3 | Tapered, rough surface |
| Example 23 | Vertical |
| Example 24 | Vertical |
| Example 25 | Vertical |
| Example 26 | Vertical |
| Example 27 | Vertical |
| Example 28 | Vertical |
| Example 29 | Vertical |
| Example 30 | Vertical |
| Example 31 | Vertical |
| Example 32 | Vertical |
| Example 33 | Vertical |

FIG. 4 (Formula 1)
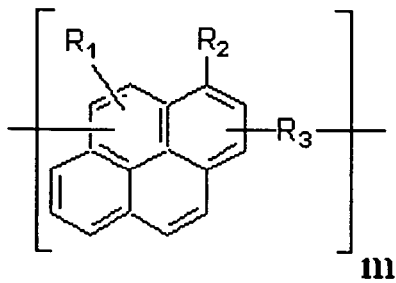
FIG. 5 ($R_3$)
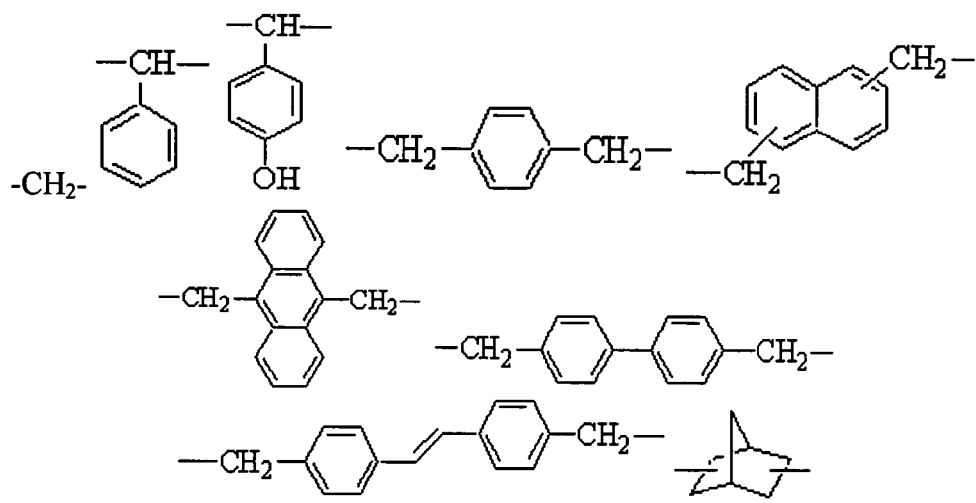
FIG. 6 (Formula 2)
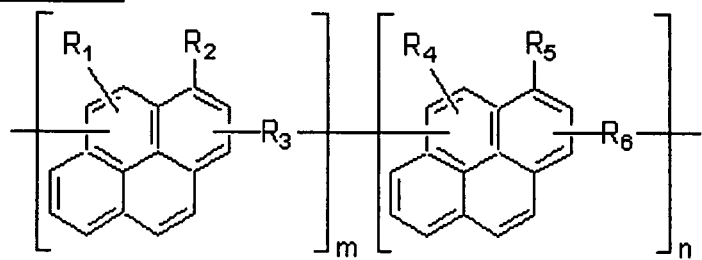

FIG. 7 ($R_6$)
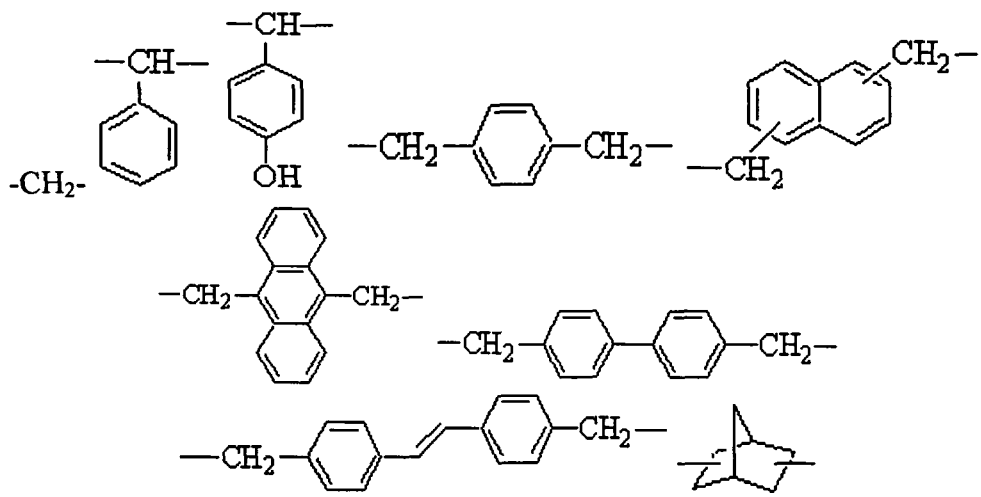
FIG. 8 (Formula 3)
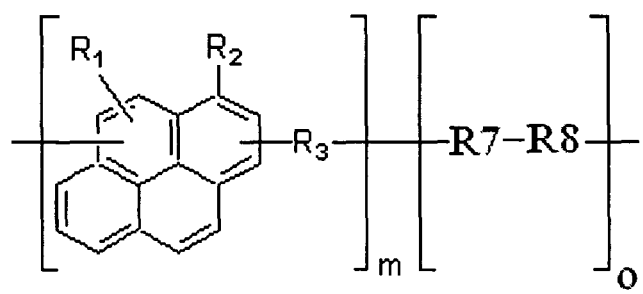

FIG. 9 ($R_7$)
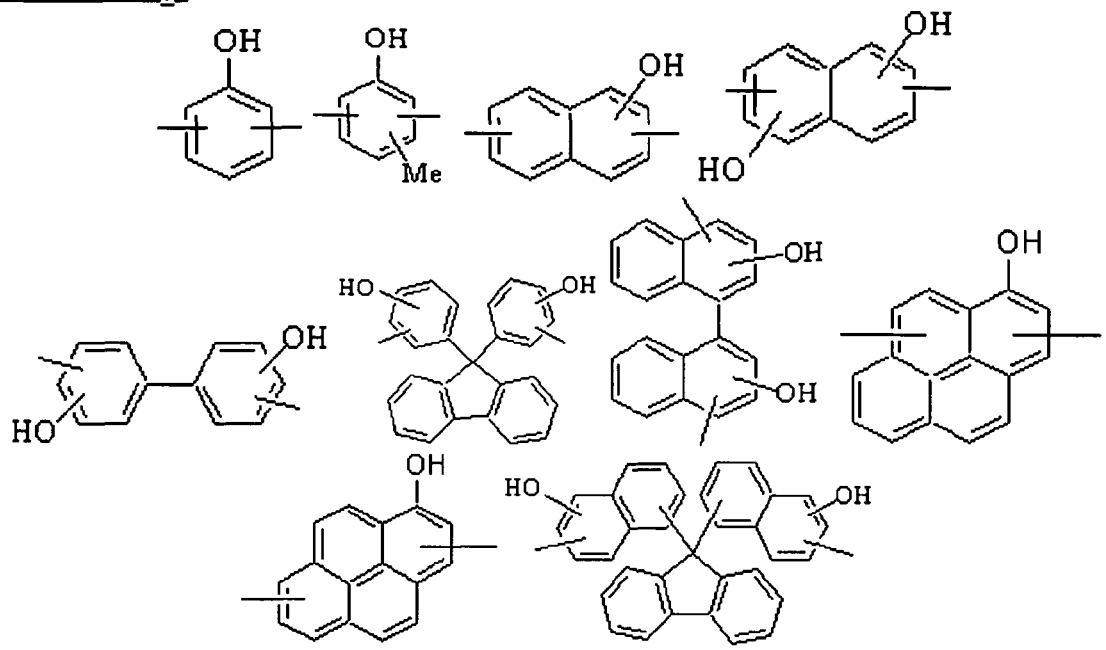
FIG. 10 ($R_8$)
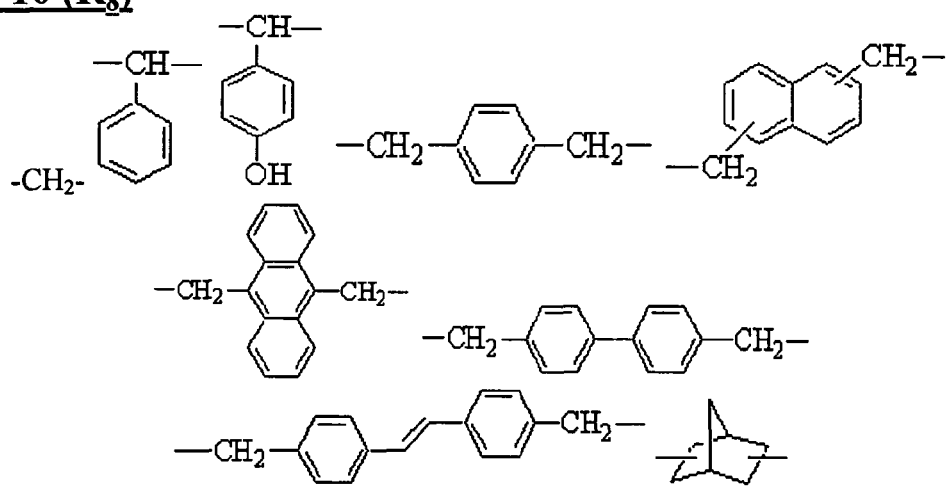

FIG. 11 (Formula 4)
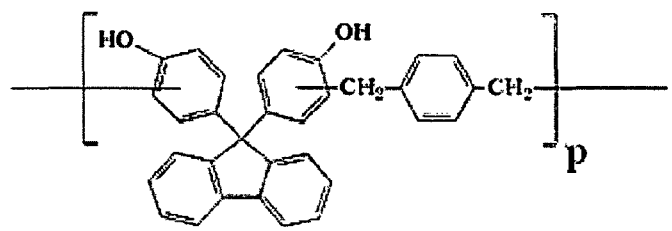
FIG. 12 (Formula 5)
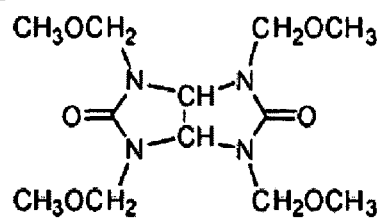
FIG. 13 (Formula 6)
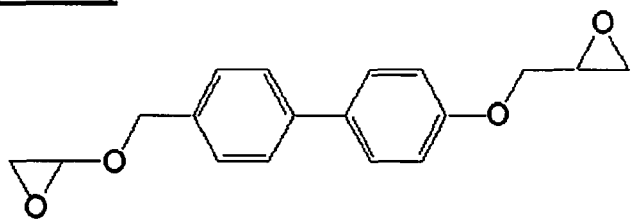
FIG. 14 (Formula 7)
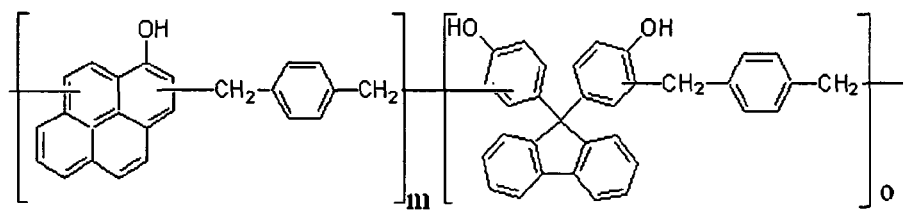

FIG. 15 (Formula 8)
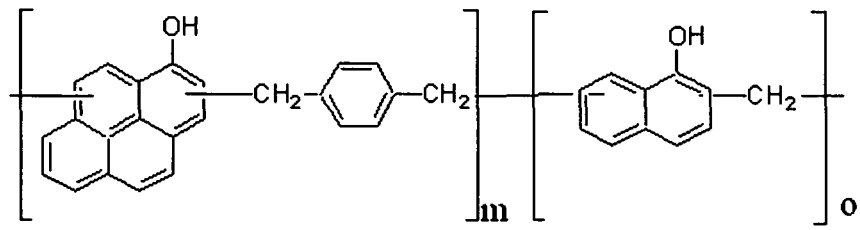
FIG. 16 (Formula 9)
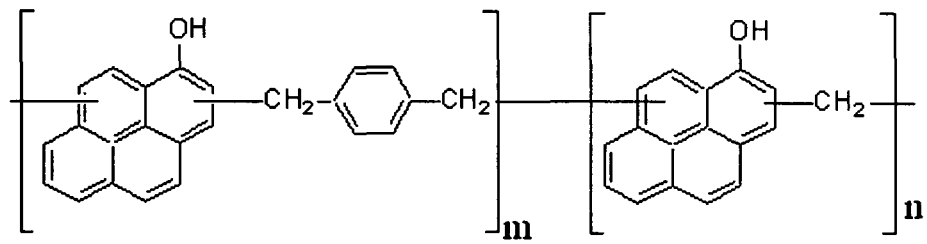
FIG. 17 (Formula 10)
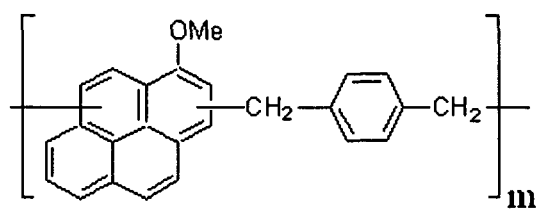
FIG. 18 (Formula 11)
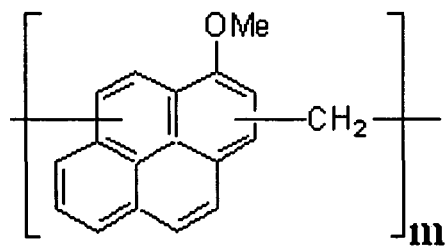

FIG. 19 (Formula 12)
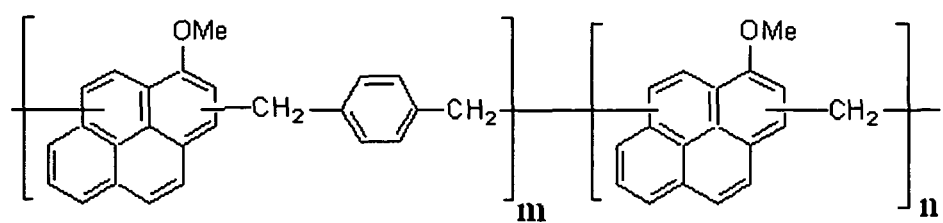
FIG. 20 (Formula 13)
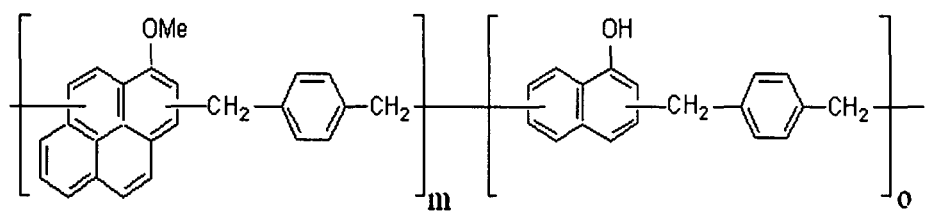

AROMATIC RING-CONTAINING POLYMER, POLYMER MIXTURE, ANTIREFLECTIVE HARDMASK COMPOSITION, AND ASSOCIATED METHODS

CROSS-REFERENCE TO RELATED APPLICATION

The present application is a continuation-in-part application of co-pending U.S. Patent Application Serial No. PCT/KR2007/007058, entitled, "Hardmask Composition Having Antireflective Property and Method of Patterning Materials Using the Same," which was filed on Dec. 31, 2007.

BACKGROUND

1. Field

Embodiments relate to an aromatic ring-containing polymer, a polymer mixture, an antireflective hardmask composition, and associated methods.

2. Description of the Related Art

There is a continuous demand for minimization in, e.g., the microelectronics industry, including the manufacture of microscopic structures, e.g., micromachines and magnetoresist heads. In the microelectronics industry, there exists a need to reduce the size of microelectronic devices in order to provide a greater number of circuits in a given chip size.

Effective lithographic techniques may be essential to achieve desired minimization. Lithography may affect the manufacture of microscopic structures by, e.g., direct imaging of patterns on particular substrates, and production of masks typically used for such imaging.

A typical lithographic process may involve patternwise exposure of a radiation-sensitive resist to imaging radiation to form a patterned resist layer. Thereafter, an image may be developed by bringing the exposed resist layer into contact with, e.g., an aqueous alkaline developing solution. An underlying layer may then be etched to transfer the pattern to the underlying layer. After completion of the transfer, remaining portions of the resist layer may be removed.

For better resolution in lithographic processes, an antireflective coating (ARC) may be used to minimize reflectivity between an imaging layer, e.g., the radiation-sensitive resist material layer, and the underlying layer. However, since much of the imaging layer may be removed during etching of the ARC after patterning, further patterning may be required in a subsequent etching step.

In other words, in some lithographic imaging processes, the resist material layer may not provide resistance to the subsequent etching step to an extent sufficient to effectively transfer the desired pattern to a layer underlying the resist. In actual applications, e.g., in the case where an extremely thin resist layer is required, an underlying material to be etched is thick, a large etching depth is needed, and/or the use of a particular etchant is required depending on the type of an underlying material, a hardmask layer may be used as an intermediate layer between the patterned resist layer and the underlying material. The hardmask layer may be patterned by transfer from the patterned resist. The hardmask layer should be able to receive the pattern from the patterned resist layer and withstand etching required to transfer the pattern to the underlying material.

SUMMARY

Embodiments are directed to an aromatic ring-containing polymer, a polymer mixture, an antireflective hardmask composition, and associated methods, which substantially overcome one or more of the problems due to the limitations and disadvantages of the related art.

It is a feature of an embodiment to provide a hardmask composition suitable for use in a lithographic process that exhibits high etch selectivity, is sufficiently resistant to multiple etching, and minimizes reflectivity between a resist and an underlying layer.

It is another feature of an embodiment to provide a method for patterning an underlying material layer on a substrate using the hardmask composition.

At least one of the above and other features and advantages may be realized by providing an aromatic ring-containing polymer including at least one aromatic ring-containing polymer represented by Formulae 1, 2, or 3 wherein in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—$NH_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is —$CH_2$—,

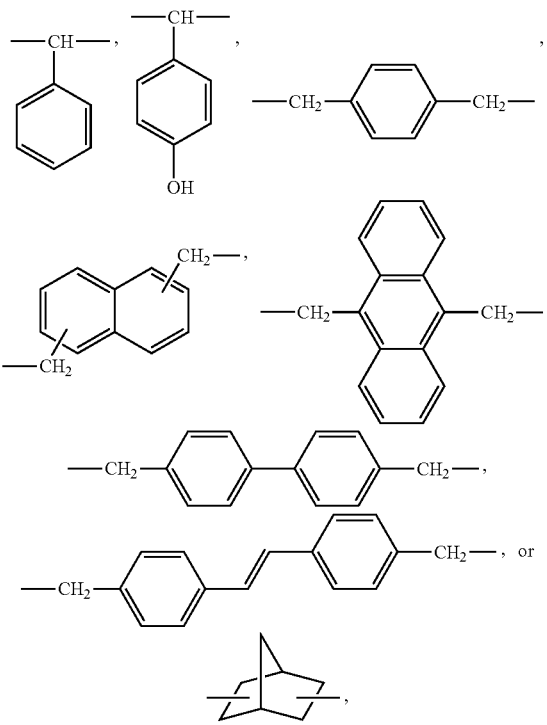

and m satisfies the relation: $1 \leq m < 190$, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—$NH_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —$CH_2$

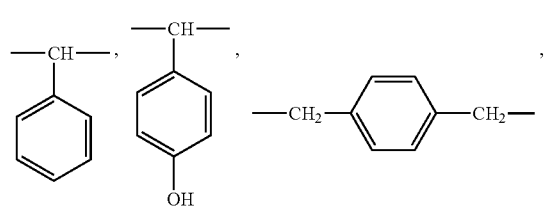

-continued

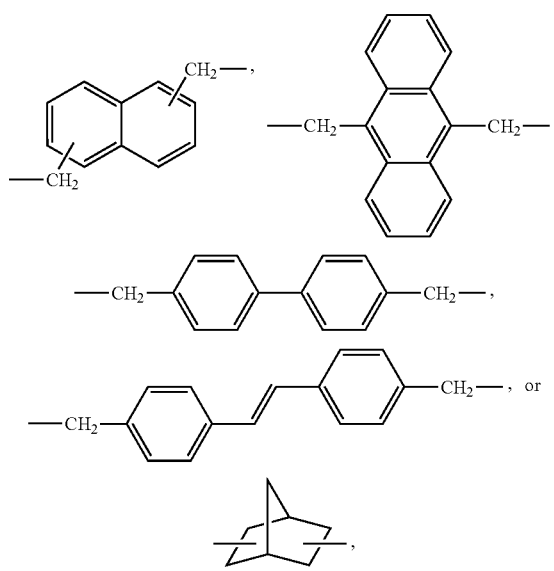

and m and n satisfy the relations: 1≦m<190, 1≦n<190, and 2<m+n<190, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$

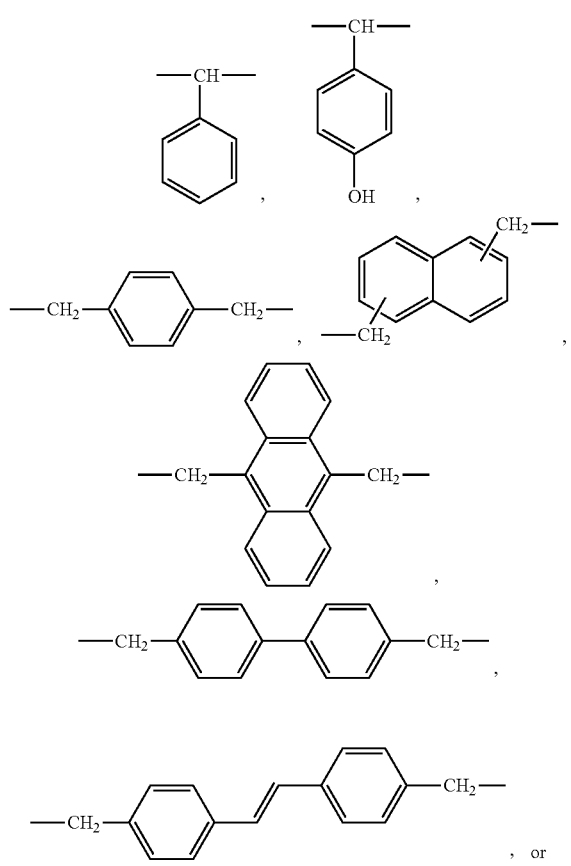

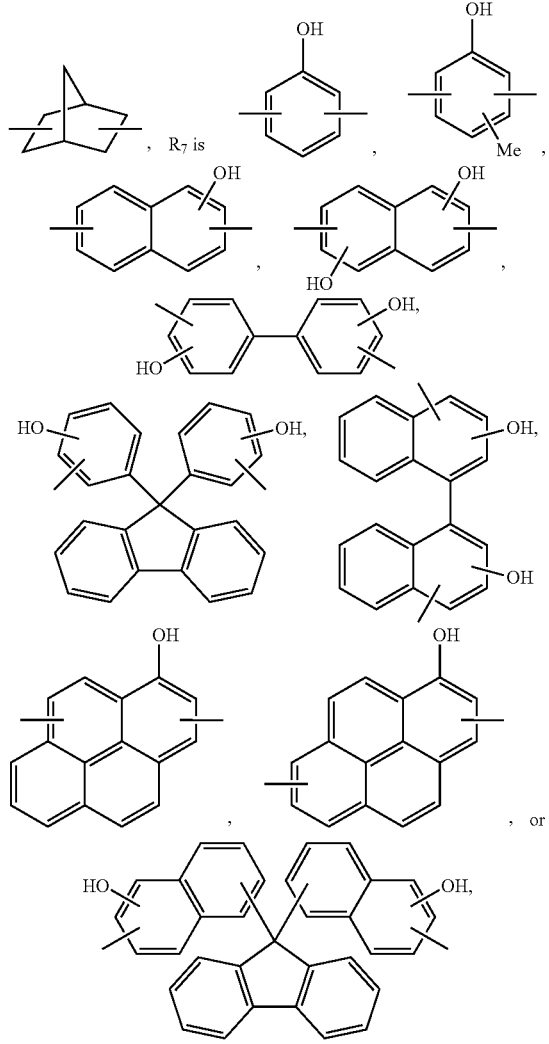

and m and o satisfy the relations: 1≦m<190, 1≦o<190, and 2≦m+o<190.

At least one of the above and other features and advantages may also be realized by providing a polymer mixture including about 10% to about 90% by weight of the polymer according to claim 1, and about 10% to about 90% by weight of an aromatic ring-containing polymer represented by Formula 4:

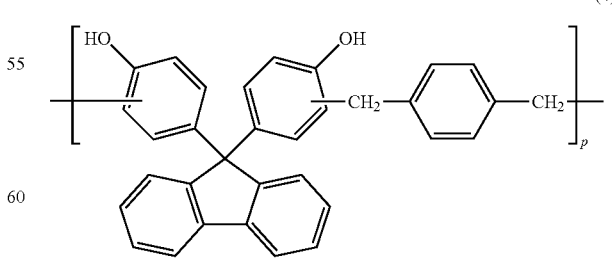

(4)

wherein, in Formula 4, p satisfies the relation: 1≦p<190.

At least one of the above and other features and advantages may also be realized by providing an antireflective hardmask composition including at least one aromatic ring-containing polymer represented by Formulae 1, 2, or 3:

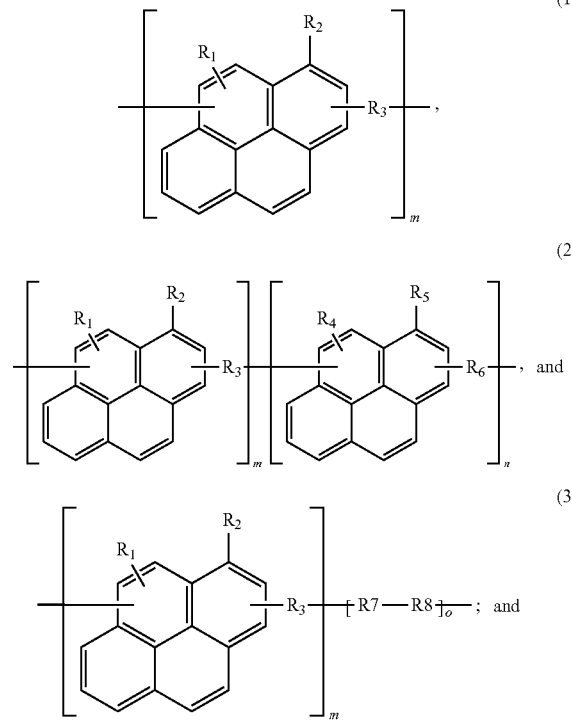

an organic solvent, wherein in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is —CH$_2$—,

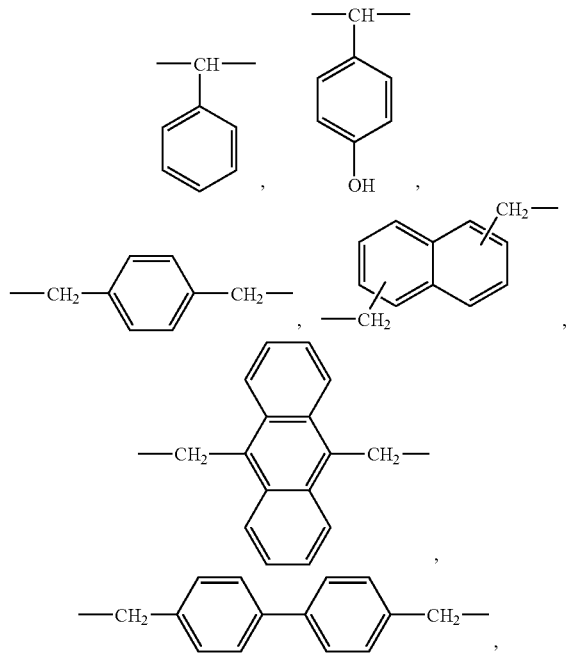

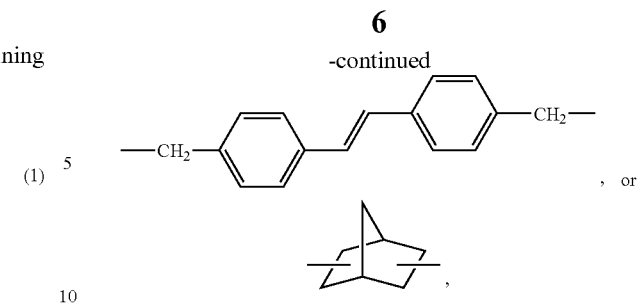

and m satisfies the relation: 1≦m<190, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —CH$_2$

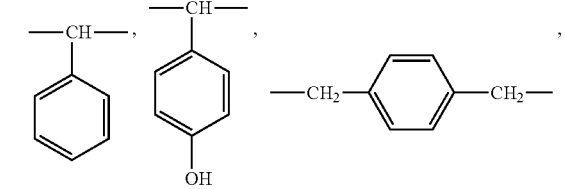

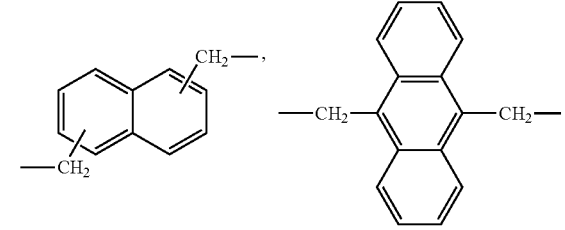

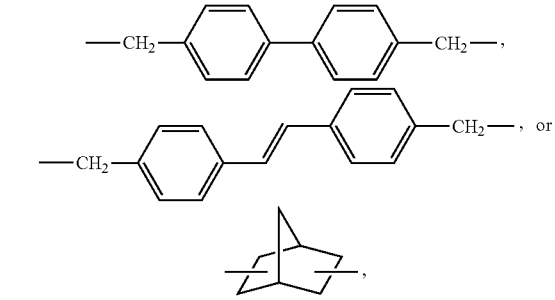

and m and n satisfy the relations: 1≦m<190, 1≦n<190, and 2≦m+n<190, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$

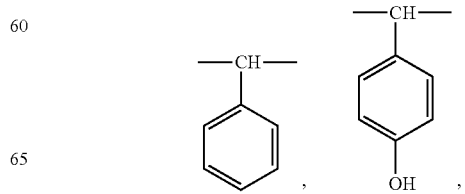

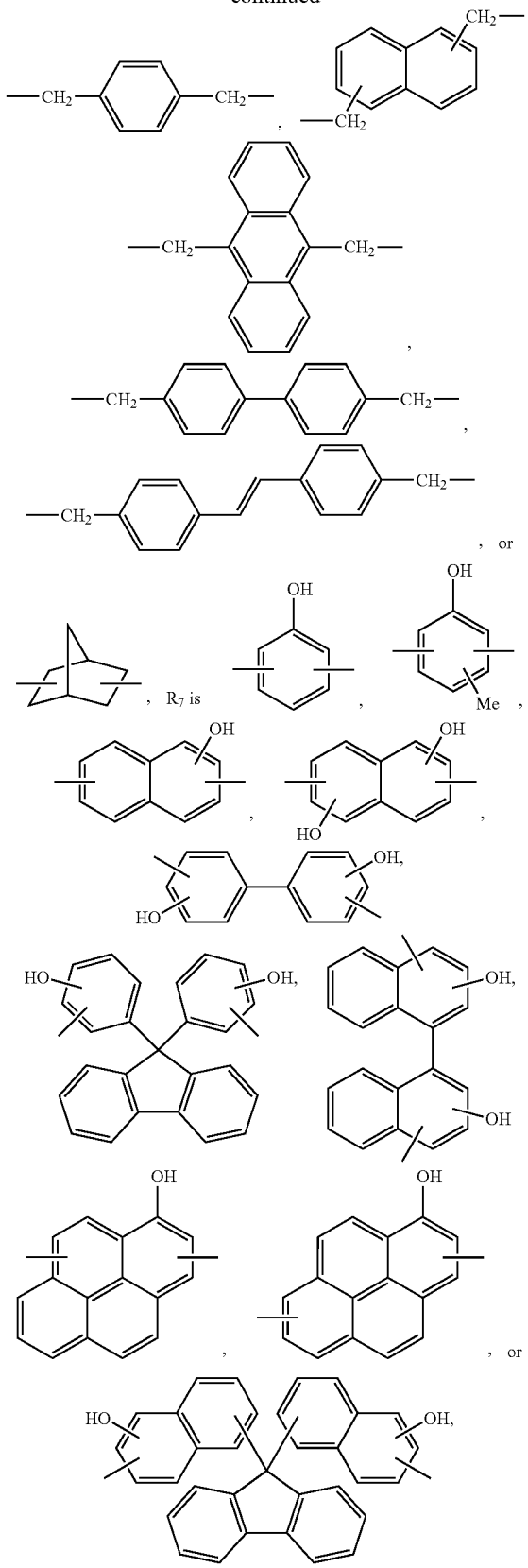

and m and o satisfy the relations: $1 \leq m < 190$, $1 \leq o < 190$, and $2 \leq m+o < 190$.

The aromatic ring-containing polymer may be present in an amount of about 1 part to about 30 parts by weight, based on 100 parts by weight of the organic solvent.

The composition may further include a crosslinking component.

The crosslinking component may include at least one of melamine resins, amino resins, glycoluril compounds, and bisepoxy compounds.

The composition may further include an acid catalyst.

The composition may include about 1% to about 20% by weight of the aromatic ring-containing polymer, about 75% to about 98.8% by weight of the organic solvent, about 0.1% to about 5% by weight of the crosslinking component, and about 0.001% to about 0.05% by weight of the acid catalyst.

The acid catalyst may include at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

The aromatic ring-containing polymer may have a weight average molecular weight of about 1,000 to about 30,000.

The composition may further include a surfactant.

The composition may further include a polymer represented by Formula 4:

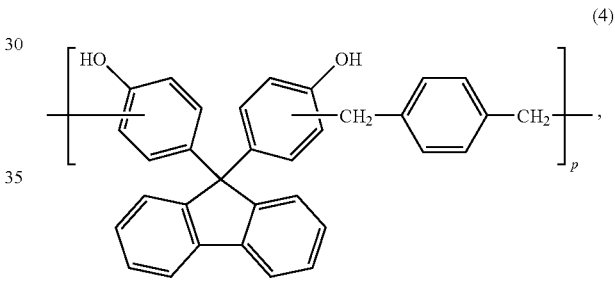

(4)

wherein, in Formula 4, p satisfies the relation: $1 \leq p < 190$.

The aromatic ring-containing polymer and the polymer represented by Formula 4 may be included in a weight ratio of about 1:9 to about 9:1.

At least one of the above and other features and advantages may also be realized by providing a method for patterning a material on a substrate including providing a material layer on a substrate; forming an antireflective hardmask layer on the material layer using an antireflective hardmask composition including at least one aromatic ring-containing polymer represented by Formulae 1, 2, or 3 and an organic solvent, wherein in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is —CH$_2$—,

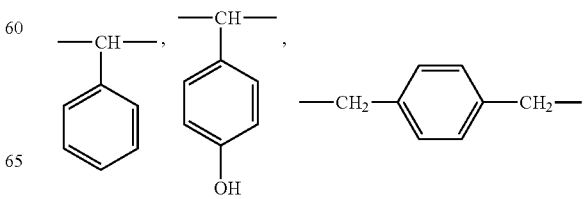

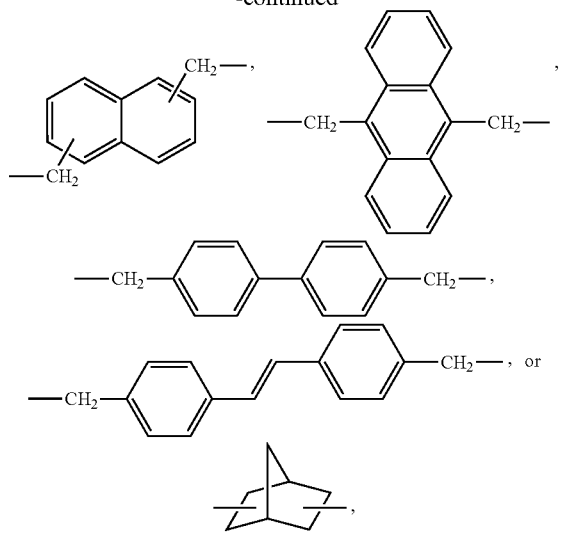

and m satisfies the relation: $1 \leq m < 190$, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —CH$_2$

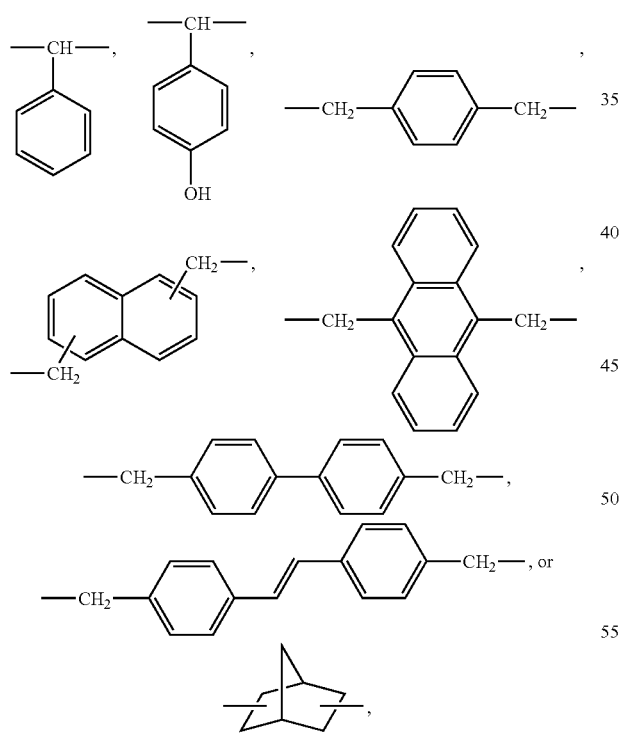

and m and n satisfy the relations: $1 \leq m < 190$, $1 \leq n < 190$, and $2 \leq m+n < 190$, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$

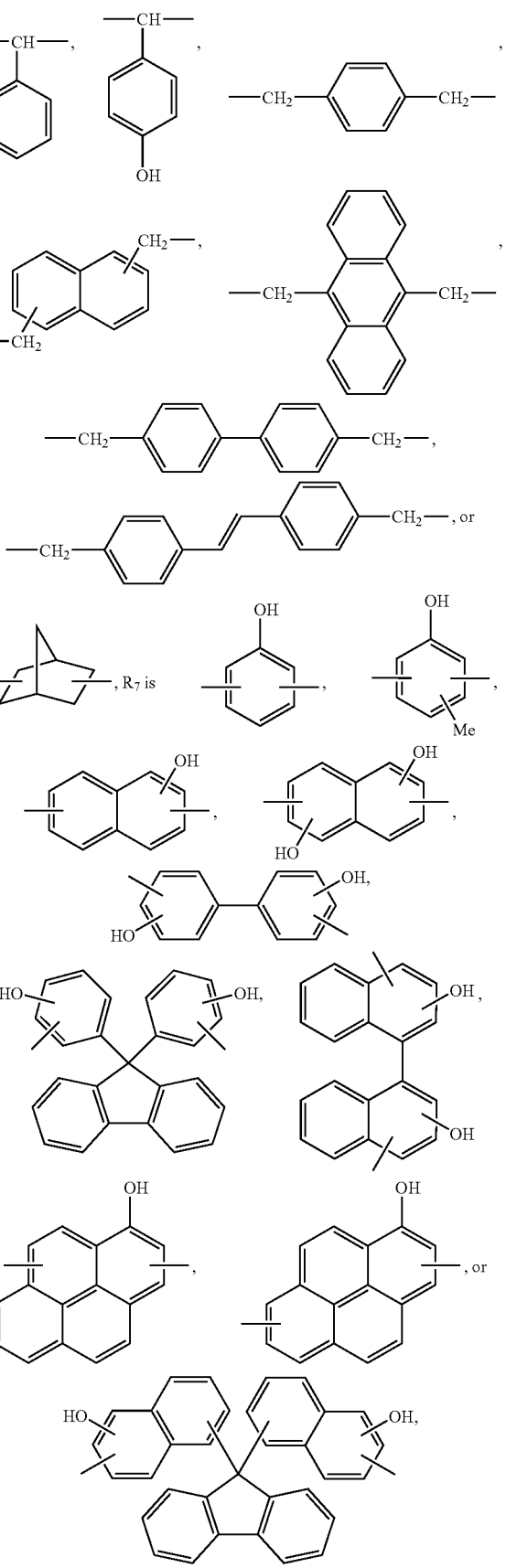

and m and o satisfy the relations: $1 \leq m < 190$, $1 \leq o < 190$, and $2 \leq m+o < 190$, forming a radiation-sensitive imaging layer on the antireflective hardmask layer, patternwise exposing the radiation-sensitive imaging layer to radiation to form a pattern of radiation-exposed regions in the imaging layer, selectively removing portions of the radiation-sensitive imaging layer and the antireflective hardmask layer to expose portions of the material layer, and etching the exposed portions of the material layer to pattern the material layer.

The method may further include forming a silicon-containing hardmask layer prior to forming the radiation-sensitive imaging layer.

The method may further include the step of forming a bottom antireflective coating (BARC) on the silicon-containing hardmask layer prior to forming the radiation-sensitive imaging layer.

The antireflective hardmask composition may further include a polymer represented by Formula 4:

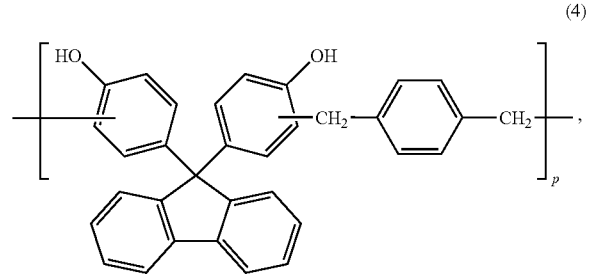

(4)

wherein, in Formula 4, p satisfies the relation: $1 \leq p < 190$.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 1 illustrates Table 1 showing samples and properties of films prepared according to Comparative Example 1 and Examples 1 to 11;

FIG. 2 illustrates Table 2 showing samples and properties of films prepared according to Comparative Example 2 and Examples 12 to 22;

FIG. 3 illustrates Table 3 showing samples and pattern shapes of films prepared according to Comparative Example 3 and Examples 23 to 33;

FIG. 4 illustrates Formula 1, representing an aromatic ring-containing polymer of an embodiment;

FIG. 5 illustrates representative examples of component $R_3$ of the aromatic ring containing polymer of Formulae 1 to 3;

FIG. 6 illustrates Formula 2, representing an aromatic ring-containing polymer of an embodiment FIG. 7 illustrates representative examples of component $R_6$ of the aromatic ring containing polymer of Formula 2;

FIG. 8 illustrates Formula 3, representing an aromatic ring-containing polymer of an embodiment FIG. 9 illustrates representative examples of component $R_7$ of the aromatic ring containing polymer of Formula 3;

FIG. 10 illustrates representative examples of component $R_8$ of the aromatic ring containing polymer of Formula 3;

FIG. 11 illustrates Formula 4, representing a polymer component of the composition of an embodiment;

FIG. 12 illustrates Formula 35 representing an example of a crosslinking component of an embodiment, Powderlink 1174;

FIG. 13 illustrates formula 6, an example of a bisepoxy compound, a crosslinking component of an embodiment;

FIG. 14 illustrates Formula 7, representing an example of an aromatic ring-containing polymer of an embodiment;

FIG. 15 illustrates Formula 8, representing an example of an aromatic ring-containing polymer of an embodiment;

FIG. 16 illustrates Formula 9, representing an example of an aromatic ring-containing polymer of an embodiment;

FIG. 17 illustrates Formula 10, representing an example of an aromatic ring-containing polymer of an embodiment;

FIG. 18 illustrates Formula 11, representing an example of an aromatic ring-containing polymer of an embodiment;

FIG. 19 illustrates Formula 12, representing an example of an aromatic ring-containing polymer of an embodiment; and FIG. 20 illustrates Formula 13, representing an example of an aromatic ring-containing polymer of an embodiment.

DETAILED DESCRIPTION

Korean Patent Application Nos. 10-2007-0032591, filed on Apr. 2, 2007; 10-2007-0051074, filed on May 25, 2007; and 10-2007-0055241, filed on Jun. 5, 2007, in the Korean Intellectual Property Office, and entitled: "Hardmask Composition Having Antireflective Property and Method of Patterning Materials Using the Same," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Exemplary embodiments will now be described in greater detail. Embodiments provide a polymer including at least one aromatic ring-containing polymer represented by Formulae 1, 2, and/or 3.

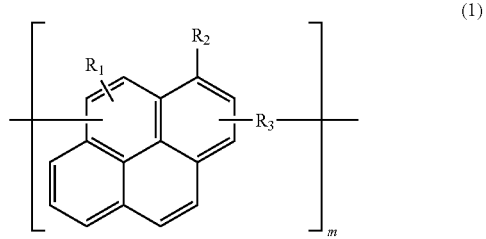

(1)

In Formula 1, $R_1$ may be hydrogen, hydroxyl (—OH), $C_1$-$C_{10}$ alkyl, $C_6$-$C_{10}$ aryl, allyl, or halogen, $R_2$ may be hydroxyl (—OH), amino (—NH$_2$), —OR (R may be $C_1$-$C_{10}$ alkyl or $C_6$-$C_{10}$ aryl), or —NRR' (R and R' may each independently be $C_1$-$C_{10}$ alkyl or $C_6$-$C_{10}$ aryl), $R_3$ may be —CH$_2$—,

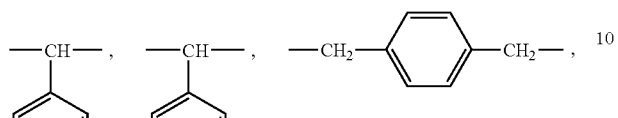

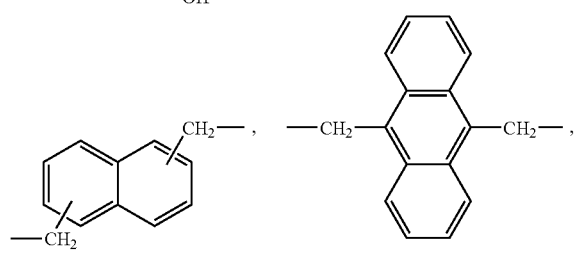

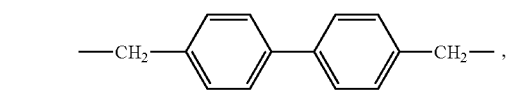

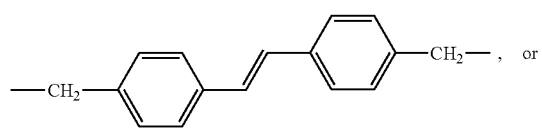

and m may satisfy the relation: 1≦m<190.

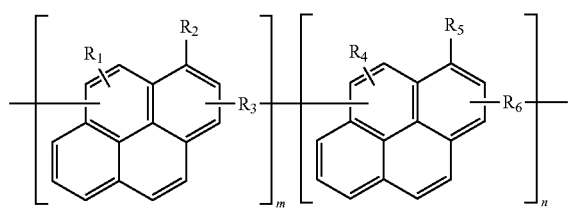

In Formula 2, $R_1$ and $R_4$ may each independently be hydrogen, hydroxyl (—OH), $C_1$-$C_{10}$ alkyl, $C_6$-$C_{10}$ aryl, allyl, or halogen, $R_2$ and $R_5$ may each independently be hydroxyl (—OH), amino (—NH$_2$), —OR (R may be $C_1$-$C_{10}$ alkyl or $C_6$-$C_{10}$ aryl), or —NRR' (R and R' may each independently be $C_1$-$C_{10}$ alkyl or $C_6$-$C_{10}$ aryl), $R_3$ and $R_6$ may each independently be —CH$_2$

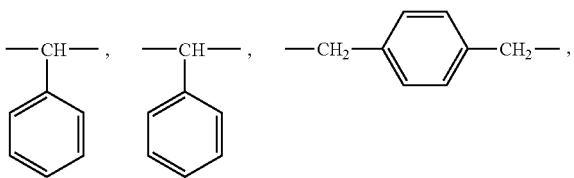

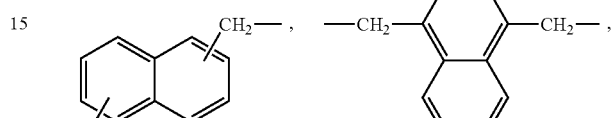

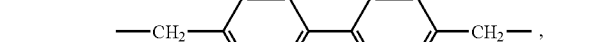

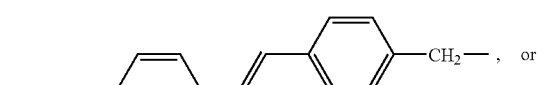

and m and n may satisfy the relations: 1≦m<190, 1≦n<190, and 2≦m+n<190.

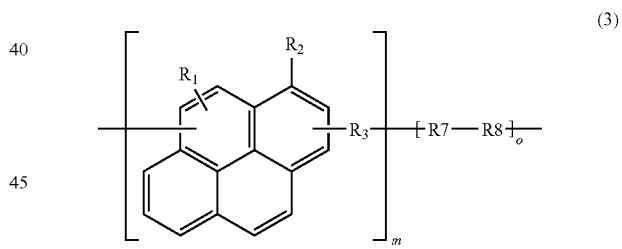

In Formula 3, $R_1$ may be hydrogen, hydroxyl (—OH), $C_1$-$C_{10}$ alkyl, $C_6$-$C_{10}$ aryl, allyl, or halogen, $R_2$ may be hydroxyl (—OH), amino (—NH$_2$), —OR (R may be $C_1$-$C_{10}$ alkyl or $C_6$-$C_{10}$ aryl), or —NRR' (R and R' may each independently be $C_1$-$C_{10}$ alkyl or $C_6$-$C_{10}$ aryl), $R_3$ and $R_8$ may each independently be —CH$_2$—,

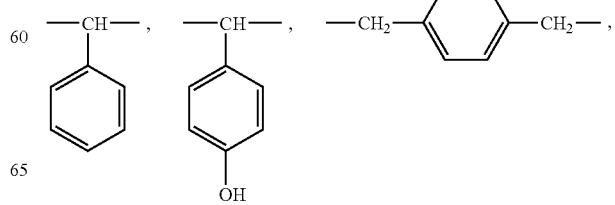

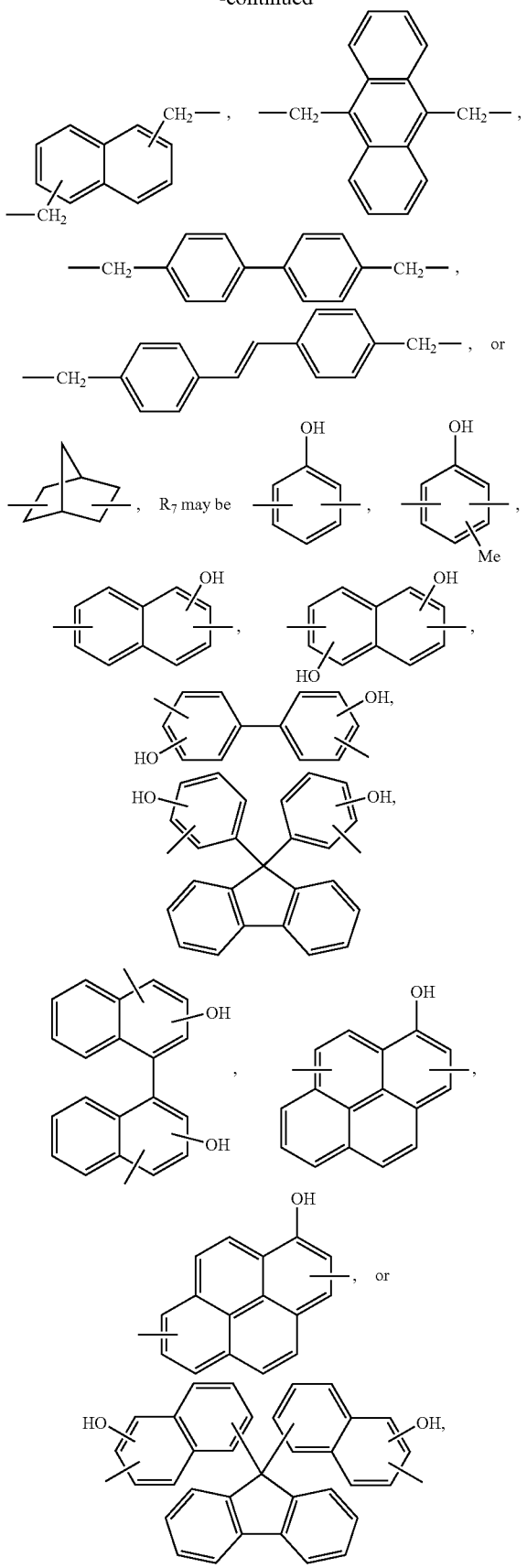

and m and o may satisfy the relations: $1 \leq m < 190$, $1 \leq o < 190$, and $2 \leq m+o < 190$.

The aromatic ring-containing polymers of Formulae 2 and 3 may have two different unit structures whose contents may be independently defined by m, n, and o. The aromatic ring-containing polymers of Formulae 2 and 3 are distinguished from the polymer of Formula 1 composed of a single repeating structure.

The polymer of an embodiment may be characterized by the presence of aromatic rings with a strong absorption in the short wavelength region, particularly, about 248 nm or below. The polymer of an embodiment may be useful as components for antireflective hardmask compositions. The aromatic ring-containing polymer including at least one polymer represented Formulae 1, 2, and 3 of an embodiment preferably has a weight average molecular weight of about 1,000 to about 30,000.

An embodiment also provides an antireflective hardmask composition including, e.g., at least one aromatic ring-containing polymer including at least one polymer represented by Formulae 1, 2, and 3, above, and an organic solvent.

The aromatic ring-containing polymer in the antireflective hardmask composition of an embodiment may include a polymer mixture of at least one of the polymers represented by Formulae 1, 2, and 3, and an aromatic ring-containing polymer represented by Formula 4:

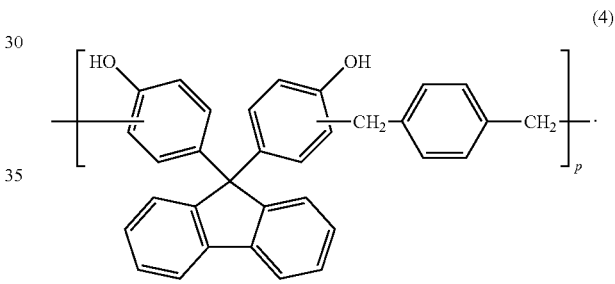

(4)

In Formula 4, p may satisfy the relation: $1 \leq p < 190$.

The polymer mixture preferably has a weight average molecular weight of about 1,000 to about 30,000. The components of the polymer mixture may interact to have a desirable effect on the etch resistance required in patterning an underlying layer. The hardmask composition of an embodiment including, e.g., at least one of the polymers represented by Formulae 1, 2, and 3, and the polymer represented by Formula 4, in an appropriate ratio may exhibit excellent physical properties in terms of solubility in common solvents, e.g., propylene glycol monomethyl ether acetate (PGMEA). The hardmask composition of an embodiment may also exhibit excellent storage stability and solvent resistance after application and baking, which may be comparable or superior to those of a hardmask composition including only at least one of the polymers of Formulae 1, 2, and/or 3.

A mixing weight ratio of the aromatic ring-containing polymer of Formulae 1, 2, and/or 3 and the polymer of Formula 4 may be about 10:90 to about 90:10. The mixing weight ratio is preferably about 25:75 to about 75:25.

It is preferred that the aromatic ring-containing polymer contains aromatic rings in the backbone of the polymer. Since the aromatic rings may absorb light of short wavelengths, e.g., 248 nm or below, during lithography, the composition of an embodiment may be used to form a hardmask layer that minimizes reflectivity between a resist and an underlying layer, thus avoiding the need of an additional antireflective coating (ARC). In addition, the aromatic ring-containing polymer of an embodiment may react with its own terminal alkoxy groups, i.e., 'self-crosslinking'. This self-crosslinking may allow the antireflective hardmask composition of an embodiment to be cured by baking without the use of an additional crosslinking component.

Also, the aromatic ring-containing polymer may have a number of reactive sites, e.g., hydroxyl groups, distributed along the backbone of the polymer to react with a crosslinking component. Accordingly, curing of the composition according to an embodiment may be promoted by crosslinking with a separate crosslinking component.

Further, the antireflective hardmask composition of an embodiment may have solution- and film-forming characteristics, which may assist in the formation of a layer by, e.g., a conventional spin-coating technique.

The aromatic ring-containing polymer including at least one polymer represented by Formulae 1, 2, and 3, or a mixture thereof with the polymer represented Formula 4 is preferably present in the antireflective hardmask composition in an amount of about 1 part to about 30 parts by weight, based on 100 parts by weight of the organic solvent. Maintaining the amount of the aromatic ring-containing polymer within these amounts may help ensure that a desired coating thickness is attained. That is, it may be easier to accurately regulate the coating thickness when the polymer is used in an amount of about 1 part by weight or greater and about 30 parts by weight or less.

There is no particular limitation on the kind of organic solvent included in the composition so long as the aromatic ring-containing polymer may be sufficiently dissolved in the organic solvent. The organic solvent may include, e.g., propylene glycol monomethyl ether acetate (PGMEA), cyclohexanone, and ethyl lactate.

The antireflective hardmask composition of an embodiment may further include a crosslinking component and an acid catalyst. The crosslinking component is preferably one that is capable of crosslinking the repeating units of the polymer upon heating in a reaction catalyzed by a generated acid. The acid catalyst is preferably one that is thermally activated. The hardmask composition of an embodiment may also include at least one additive, e.g., a surfactant.

The acid catalyst may include organic acids, e.g., p-toluenesulfonic acid monohydrate. In view of storage stability, a thermal acid generator (TAG) may be used as the acid catalyst. A TAG is a compound that generates an acid upon thermal treatment. The TAG may include, e.g., pyridinium p-toluenesulfonate, 2,4,4,6-tetrabromocyclohexadienone, benzoin tosylate, 2-nitrobenzyl tosylate, and alkyl esters of organic sulfonic acids. Other suitable radiation-sensitive acid catalysts known in the field of resists may also be used so long as they are compatible with the other components of the antireflective composition.

Any suitable crosslinking component capable of reacting with a number of reactive sites, e.g., hydroxyl groups, distributed along the backbone of the aromatic ring-containing polymer in a manner that may be catalyzed by a generated acid may be used in the hardmask composition of an embodiment. The crosslinking component may include etherified amino resins, methylated melamine resins, e.g., N-methoxymethyl-melamine resins, butylated melamine resins, e.g., N-butoxymethyl-melamine resins, methylated and butylated urea resins, e.g., Cymel U-65 Resin and UFR 80 Resin, glycoluril derivatives, e.g., Powderlink 1174, Cytec Industries Inc., and 2,6-bis(hydroxymethyl)-p-cresol.

Powderlink 1174 is a compound represented by Formula 5:

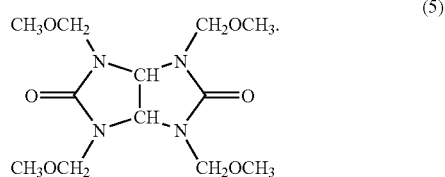

The crosslinking component may include a bisepoxy compound of Formula 6:

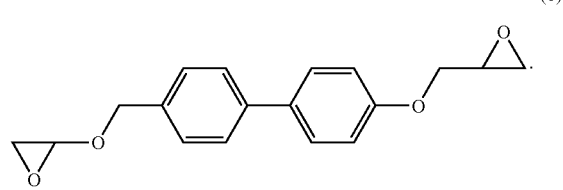

In the hardmask composition of an embodiment, the aromatic ring-containing polymer with a strong absorption in the short wavelength region is preferably present in an amount of about 1% to about 20% by weight, based on the total weight of the composition. More preferably, the aromatic ring-containing polymer is present in an amount of about 3% to about 10% by weight. The organic solvent is preferably present in an amount of about 75% to about 98.8% by weight. The crosslinking component is preferably present in an amount of about 0.1% to about 5% by weight. More preferably, the crosslinking component is present in an amount of about 0.1% to about 3% by weight. The acid catalyst is preferably present in an amount of about 0.001% to about 0.05% by weight. More preferably, the acid catalyst is present in an amount of about 0.001% to about 0.03% by weight.

Maintaining the content of the aromatic ring-containing polymer within these amounts may help ensure that a desired coating thickness is attained, i.e. it is easier to accurately regulate the coating thickness. Maintaining the content of the organic solvent within these amounts may also help ensure that a desired coating thickness is attained, i.e. it is easier to accurately regulate the coating thickness.

Maintaining the content of the crosslinking component at about 0.1% by weight or greater may help ensure that crosslinking properties are exhibited. Maintaining the content of the crosslinking component at about 5% by weight or less may help ensure that optical properties of a coating film are not undesirably changed.

Maintaining the content of the acid catalyst at about 0.001% by weight or greater may also help ensure that crosslinking properties are exhibited. Maintaining the content of the acid catalyst at about 0.05% by weight or less may help ensure that storage stability of the composition is not adversely affected.

Embodiments also provide a method for patterning an underlying material layer on a substrate using the hardmask composition. Specifically, the method of an embodiment may include (a) providing a material layer on a substrate, (b) forming an antireflective hardmask layer using the composition on the material layer, (c) forming a radiation-sensitive imaging layer on the antireflective hardmask layer, (d) patternwise exposing the radiation-sensitive imaging layer to radiation to form a pattern of radiation-exposed regions in the imaging layer, (e) selectively removing portions of the radiation-sensitive imaging layer and the hardmask layer to expose portions of the material layer, and (f) etching the exposed portions of the material layer to pattern the material layer.

The method may further include forming a silicon-containing hardmask layer on the antireflective hardmask layer prior to forming the radiation-sensitive imaging layer. The method may further include forming a bottom antireflective coating (BARC) on the silicon-containing hardmask layer prior to forming the radiation-sensitive imaging layer.

Specifically, the method of an embodiment may be carried out in accordance with the following procedure. First, a material, e.g., aluminum or silicon nitride (SiN), to be patterned may be applied to, e.g., a silicon substrate, by any suitable technique to form a material layer. The material may be, e.g., an electrically conductive, semi-conductive, magnetic, or insulating material. Thereafter, the hardmask composition of an embodiment may be spin-coated to a thickness of about 500 Å to about 4,000 Å, and then baked at about 100° C. to about 300° C. for about 10 seconds to about 10 minutes to form a hardmask layer. Then, a silicon-containing hardmask composition may be spin-coated to a thickness of about 500 Å to about 4,000 Å on the hardmask layer, and then baked at about 100° C. to about 300° C. for about 10 seconds to about 10 minutes to form a silicon-containing hardmask layer. If desired, a bottom antireflective coating (BARC) may be formed on the silicon-containing hardmask layer.

A radiation-sensitive image layer may be formed on the hardmask layer, silicon-containing hardmask layer, or BARC. Light exposure and development may be performed to form a pattern in the imaging layer. Exposed portions of the, e.g., silicon containing hardmask layer, may be dry-etched using a gas mixture, e.g., $CHF_3/CF_4$, to form a pattern in the silicon-containing hardmask layer. After the dry etching, exposed portions of the hardmask layer may be etched using a gas mixture, e.g., $BCl_3/Cl_2$, to pattern the hardmask layer.

Exposed potions of the material layer may be dry-etched using a gas mixture, e.g., $CHF_3/CF_4$, to pattern the material layer. Plasma, e.g., oxygen plasma, may be used to remove the hardmask materials, leaving only the patterned material layer on the substrate. The method of an embodiment may be applied to, e.g., the fabrication of a semiconductor integrated circuit device.

Accordingly, the composition of an embodiment, and the resulting lithographic structure, may be used in the fabrication and design of integrated circuit devices. The composition of an embodiment may be used in the formation of patterned material layer structures, e.g., metal wirings, holes for contacts and biases, insulating sections (e.g., damascene trenches (DTs), and shallow trench isolation (STI)), as well as trenches for capacitor structures. The embodiments are not restricted to any particular lithographic techniques and device structures.

Hereinafter, embodiments will be explained in more detail with reference to the following examples. However, these examples are given for the purpose of illustration only and are not intended to limit the scope.

EXAMPLES

Synthesis Example 1

A 2,000 ml three-neck flask equipped with a thermometer, a condenser, a mechanical agitator, and a dropping funnel was immersed in an oil bath at 140° C. Heating and magnetic stirring were conducted on a hot plate, and the temperature of cooling water in the condenser was adjusted to 40° C. 220.27 g (1 mol) of 4,6-dihydropyrene-1-ol was added to the reactor and dissolved in 656.02 g of propylene glycol monomethyl ether acetate (PGMEA). To the solution was added 4.63 g (0.03 mol) of diethyl sulfate (DS).

116.35 g (0.7 mol) of 1,4-bis(methoxymethyl)benzene (MMB) was introduced into the dropping funnel. When the temperature of the reactor reached 130° C., the MMB was very slowly added dropwise to the reactor over 1.5 hours to carry out the polymerization of the reactants.

The molecular weight of the reaction mixture was measured at regular time intervals during polymerization to determine when the reaction was finished. For the measurement of the molecular weight, 1 g of the reaction mixture was sampled from the reactor and rapidly cooled to room temperature. 0.02 g of the sample was diluted with THF as a solvent until the solids content became 4 wt %. When the reaction was determined to be finished, 4.48 g (0.03 mol) of triethanolamine as a neutralizing agent was added to the reactor and stirred to quench the reaction. The reaction mixture was slowly cooled to room temperature.

The reaction mixture was diluted with 500 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the flask and the supernatant was separately stored. The methanol was removed using a rotary evaporator at 60° C. for 10 minutes, leaving a copolymer.

The molecular weight and the polydispersity of the copolymer were measured by gel permeation chromatography (GPC) in THF. The copolymer was found to have a molecular weight of 12,000 and a polydispersity of 2.3.

Synthesis Example 2

A copolymer was synthesized in the same manner as in Synthesis Example 1, except that 21.02 g (0.7 mol) of paraformaldehyde was used instead of 116.35 g (0.7 mol) of MMB.

The molecular weight and the polydispersity of the copolymer were measured by GPC in THF. The copolymer was found to have a molecular weight of 15,000 and a polydispersity of 2.6.

Synthesis Example 3

A copolymer was synthesized in the same manner as in Synthesis Example 1, except that a mixture of 15.02 g (0.5 mol) of paraformaldehyde and 83.11 g of MMB was used instead of 116.35 g (0.7 mol) of MMB.

The molecular weight and the polydispersity of the copolymer were measured by GPC in THF. The copolymer was found to have a molecular weight of 12,000 and a polydispersity of 2.4.

Synthesis Example 4

A 2,000 ml three-neck flask equipped with a thermometer, a condenser, a mechanical agitator, and a dropping funnel was immersed in an oil bath at 140° C. Heating and magnetic stirring were conducted on a hot plate, and the temperature of cooling water in the condenser was adjusted to 40° C. 65.48 g (1 mol) of 1-hydroxypyrene and 103.12 g of 9,9'-bis(phenol)fluorene were added to the reactor and dissolved in 270.34 g of propylene glycol monomethyl ether acetate (PGMEA). To the solution was added 4.62 g (0.05 mol) of diethyl sulfate (DS).

199.48 g (2.0 mol) of 1,4-bis(methoxymethyl)benzene (MMB) was introduced into the dropping funnel. When the temperature of the reactor reached 130° C., the MMB was very slowly added dropwise to the reactor over 1.5 hours to carry out the polymerization of the reactants.

The molecular weight of the reaction mixture was measured at regular time intervals during polymerization to determine when the reaction was finished. For the measurement of the molecular weight, 1 g of the reaction mixture was sampled from the reactor and rapidly cooled to room temperature. 0.02 g of the sample was diluted with THF as a solvent until the solids content became 4 wt %. When the reaction was determined to be finished, 4.48 g (0.03 mol) of triethanolamine as a neutralizing agent was added to the reactor and stirred to quench the reaction. The reaction mixture was slowly cooled to room temperature.

The reaction mixture was diluted with 500 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the flask and the supernatant was separately stored. The methanol was removed using a rotary evaporator at 60° C. for 10 minutes, leaving a copolymer of Formula 7.

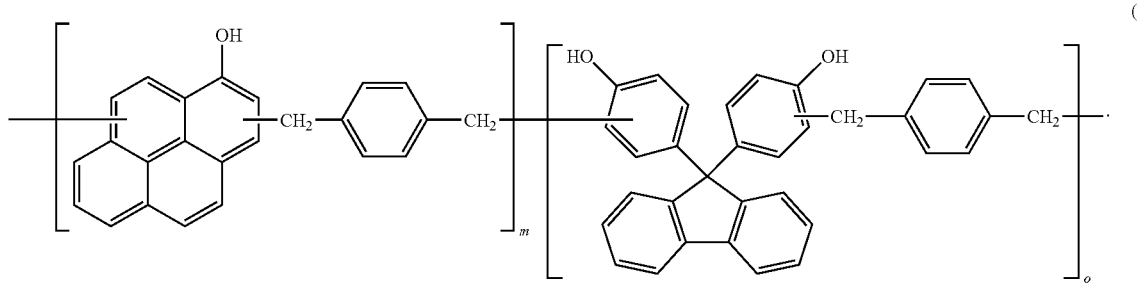

(7)

In Formula 7, m is 8 or 9 and n is 6 or 7.

The molecular weight and the polydispersity of the copolymer were measured by GPC in THF. The copolymer was found to have a weight average molecular weight of 12,000 and a polydispersity of 2.3.

Synthesis Example 5

A 2,000 ml three-neck flask equipped with a thermometer, a condenser, a mechanical agitator, and a dropping funnel was immersed in an oil bath at 140° C. Heating and magnetic stirring were conducted on a hot plate, and the temperature of cooling water in the condenser was adjusted to 40° C. 65.48 g (1 mol) of 1-hydroxypyrene and 32.57 g (1 mol) of 2-naphthol were added to the reactor and dissolved in 270.34 g of propylene glycol monomethyl ether acetate (PGMEA). To the solution were sequentially added 8.26 g (1 mol) of formaldehyde and 4.62 g (0.05 mol) of diethyl sulfate (DS). 99.74 g (1 mol) of 1,4-bis(methoxymethyl)benzene (MMB) was introduced into the dropping funnel. When the temperature of the reactor reached 130° C., the MMB was very slowly added dropwise to the reactor over 1.5 hours to carry out the polymerization of the reactants.

The molecular weight of the reaction mixture was measured at regular time intervals during polymerization to determine when the reaction was finished. For the measurement of the molecular weight, 1 g of the reaction mixture was sampled from the reactor and rapidly cooled to room temperature. 0.02 g of the sample was diluted with THF as a solvent until the solids content became 4 wt %. When the reaction was determined to be finished, 4.48 g (0.03 mol) of triethanolamine as a neutralizing agent was added to the reactor and stirred to quench the reaction. The reaction mixture was slowly cooled to room temperature.

The reaction mixture was diluted with 500 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the flask and the supernatant was separately stored. The methanol was removed using a rotary evaporator at 60° C. for 10 minutes, leaving a copolymer of Formula 8.

found to have a weight average molecular weight of 10,500 and a polydispersity of 2.4.

Synthesis Example 6

A 2,000 ml three-neck flask equipped with a thermometer, a condenser, a mechanical agitator, and a dropping funnel was immersed in an oil bath at 140° C. Heating and magnetic stirring were conducted on a hot plate, and the temperature of cooling water in the condenser was adjusted to 40° C. 65.48 g (1 mol) of 1-hydroxypyrene was added to the reactor and dissolved in 135.17 g of propylene glycol monomethyl ether acetate (PGMEA). To the solution were sequentially added 15.02 g (0.5 mol) of paraformaldehyde and 4.62 g (0.05 mol) of diethyl sulfate (DS). 83.11 g (0.5 mol) of 1,4-bis(methoxymethyl)benzene (MMB) was introduced into the dropping funnel. When the temperature of the reactor reached 130° C., the MMB was very slowly added dropwise to the reactor over 1.5 hours to carry out the polymerization of the reactants.

The molecular weight of the reaction mixture was measured at regular time intervals during polymerization to determine the time when the reaction was finished. For the measurement of the molecular weight, 1 g of the reaction mixture was sampled from the reactor and rapidly cooled to room temperature. 0.02 g of the sample was diluted with THF as a solvent until the solids content became 4 wt %. When the reaction was determined to be finished, 4.48 g (0.03 mol) of triethanolamine as a neutralizing agent was added to the reactor and stirred to quench the reaction. The reaction mixture was slowly cooled to room temperature.

The reaction mixture was diluted with 500 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the (8)

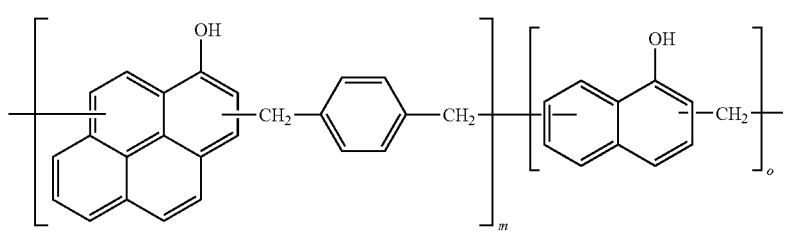

In Formula 8, m is 13 or 14 and n is 11 or 12.

The molecular weight and the polydispersity of the copolymer were measured by GPC in THF. The copolymer was flask and the supernatant was separately stored. The methanol was removed using a rotary evaporator at 60° C. for 10 minutes, leaving a copolymer of Formula 9.

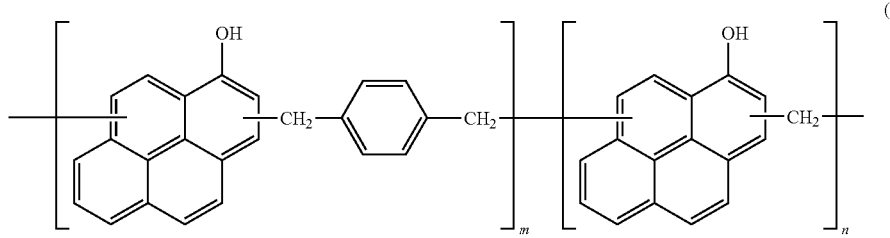

In Formula 9, m is 10 or 11 and n is 9 or 10.

The molecular weight and the polydispersity of the copolymer were measured by GPC in THF. The copolymer was found to have a weight average molecular weight of 11,200 and a polydispersity of 2.1.

Synthesis Example 7

A 2,000 ml three-neck flask equipped with a thermometer, a condenser, a mechanical agitator, and a dropping funnel was immersed in an oil bath at 140° C. Heating and magnetic stirring were conducted on a hot plate, and the temperature of cooling water in the condenser was adjusted to 40° C. 220 g (1 mol) of 1-methoxypyrene and 138 g (1.0 mol) of 1,4-bis (methoxymethyl)benzene (MMB) were added to the reactor and dissolved in 656 g of propylene glycol monomethyl ether acetate (PGMEA). To the solution was added 4.6 g (0.03 mol) of diethyl sulfate (DS).

The polymerization of the reactants was carried out while maintaining the temperature of the reactor at 130° C. The molecular weight of the reaction mixture was measured at regular time intervals during polymerization to determine the time when the reaction was finished. For the measurement of the molecular weight, 1 g of the reaction mixture was sampled from the reactor and rapidly cooled to room temperature. 0.02 g of the sample was diluted with THF as a solvent until the solids content became 4 wt %. When the reaction was determined to be finished, 4.48 g (0.03 mol) of triethanolamine as a neutralizing agent was added to the reactor and stirred to quench the reaction. The reaction mixture was slowly cooled to room temperature.

The reaction mixture was diluted with 500 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the flask and the supernatant was separately stored. The methanol was removed using a rotary evaporator at 60° C. for 10 minutes, leaving a polymer represented by Formula 10.

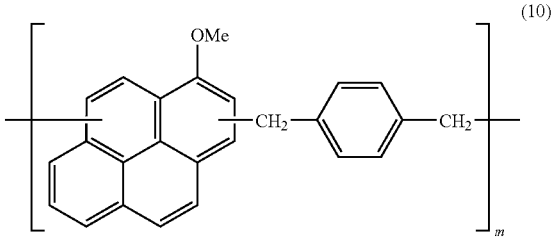

In Formula 10, m is an average of 11 and Me is —$CH_3$.

The molecular weight and the polydispersity of the polymer were measured by GPC in THF. The polymer was found to have a weight average molecular weight of 4,000 and a polydispersity of 2.3.

Synthesis Example 8

The procedure of Synthesis Example 7 was repeated except that 30 g (1.0 mol) of paraformaldehyde was used instead of 166 g (1 mol) of MMB to synthesize a polymer represented by Formula 11.

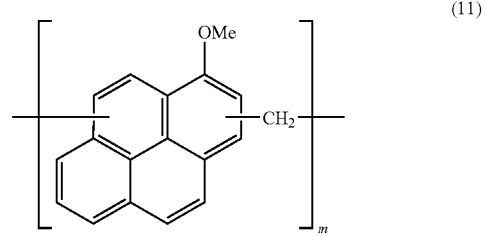

In Formula 11, m is an average of 19 and Me is —$CH_3$.

The molecular weight and the polydispersity of the copolymer were measured by GPC in THF. The copolymer was found to have a molecular weight of 5,000 and a polydispersity of 2.6.

Synthesis Example 9

The procedure of Synthesis Example 7 was repeated except that a mixture of 15 g (0.5 mol) of paraformaldehyde and 83 g (0.5 mol) of MMB was used instead of 166 g (1 mol) of MMB to synthesize a copolymer represented by Formula 12.

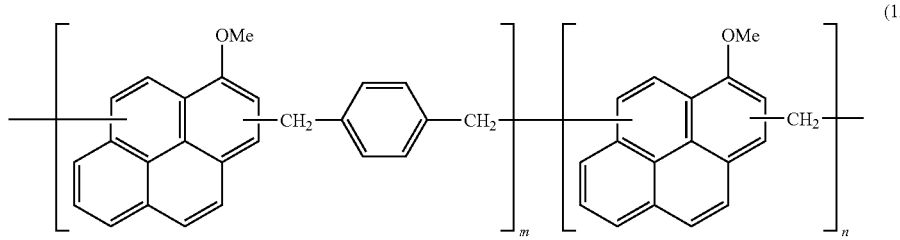

In Formula 12, the sum m+n is an average of 13 and Me is —CH$_3$.

The molecular weight and the polydispersity of the copolymer were measured by GPC in THF. The copolymer was found to have a molecular weight of 4,000 and a polydispersity of 2.4.

Synthesis Example 10

The procedure of Synthesis Example 7 was repeated except that a mixture of 110 g (0.5 mol) of 1-methoxypyrene and 72 g (0.5 mol) of 1-naphthol was used instead of 220 g (1.0 mol) of 1-methoxypyrene to synthesize a copolymer represented by Formula 13.

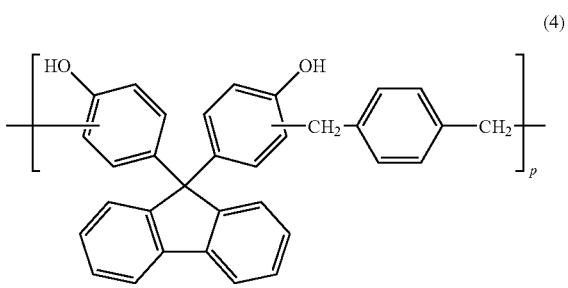

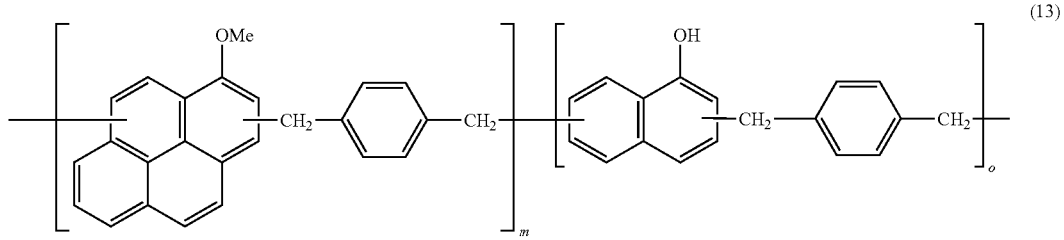

In Formula 13, the sum m+n is an average of 16 and Me is —CH$_3$.

The molecular weight and the polydispersity of the copolymer were measured by GPC in tetrahydrofuran. The copolymer was found to have a molecular weight of 5,000 and a polydispersity of 2.4.

Comparative Synthesis Example 1

8.75 g (0.05 mole) of α,α'-dichloro-p-xylene, 26.66 g of aluminum chloride and 200 g of γ-butyrolactone were well stirred in a 1 L four-neck flask equipped with a mechanical agitator, a condenser, a 300 ml dropping funnel, and a nitrogen inlet tube while feeding nitrogen into the flask. After 10 minutes, to the mixture was slowly added dropwise a solution of 35.03 g (0.10 mol) of 4,4'-(9-fluorenylidene)diphenol in 200 g of γ-butyrolactone for 30 minutes. The resulting mixture was allowed to react for 12 hours. After completion of the reaction, water was used to remove acids from the reaction mixture, followed by concentration using an evaporator. The concentrate was diluted with methyl amyl ketone (MAK) and methanol to obtain a 15 wt % solution in MAK/methanol (4/1 (w/w)). The solution was transferred to a 3 liter separatory funnel, and then n-heptane was added thereto to remove low-molecular weight compounds containing the oligomers and monomers, affording the polymer represented by Formula 4 (Mw=12,000, polydispersity=2.0, p=23).

Preparative Example 1

Mixing of the Polymer Prepared in Synthesis Example 4 and the Polymer Prepared in Comparative Synthesis Example 1

50% by weight of the polymer (Formula 7) prepared in Synthesis Example 4 and 50% by weight of the polymer (Formula 4) prepared in Comparative Synthesis Example 1 were dissolved in 270.34 g of propylene glycol monomethyl ether acetate (PGMEA).

Examples 1 to 11

0.8 g of each of the polymers prepared in Synthesis Examples 1 to 10 and the solution prepared in Preparative Example 1, 0.2 g of Powderlink 1174 (Formula 5, Cytec Industries Inc.) as a crosslinker, and 2 mg of pyridinium p-toluenesulfonate were dissolved in 9 g of propylene glycol monomethyl ether acetate (PGMEA), and filtered to prepare a sample solution.

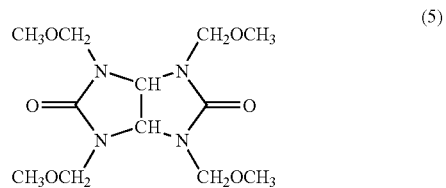

Each of the sample solutions was spin-coated on a silicon wafer and baked at 240° C. for 60 seconds to form a 3,000 Å-thick film.

The refractive index (n) and the extinction coefficient (k) of the films were measured using an ellipsometer (J. A. Woollam). The results are shown in Table 1 of FIG. 1.

The data of Table 1 show that the films are suitable for use as antireflective films at wavelengths of 193 nm (ArF) and 248 nm (KrF).

Comparative Example 1

0.8 g of the polymer prepared in Comparative Synthesis Example 1, 0.2 g of a crosslinker (Cymel 303, Cytec Industries Inc.) and 2 mg of pyridinium p-toluenesulfonate were dissolved in 9 g of PGMEA, and filtered to prepare a sample solution.

The sample solution was spin-coated on a silicon wafer and baked at 240° C. for 60 seconds to form a 3,000 Å-thick film.

The refractive index (n) and the extinction coefficient (k) of the film were measured using an ellipsometer (J. A. Woollam). The results are shown in Table 1.

The results of Table 1 reveal that the film had a refractive index and an absorbance (extinction coefficient) suitable for use as an antireflective film at 193 nm (KrF) but showed a relatively low absorbance at 248 nm (KrF).

Examples 12 to 22

Each of the sample solutions prepared in Examples 1 to 111 were spin-coated on an aluminum-coated silicon wafer and baked at 240° C. for 60 seconds to form a 3,000 Å thick film.

A KrF photoresist was coated on the film, baked at 110° C. for 60 seconds, exposed to light in an exposure system (XT: 1400, NA 0.93, manufactured by ASML), and developed with an aqueous solution of tetramethylammonium hydroxide (TMAH) (2.38 wt %) to form a 90-nm line and space pattern. The patterns were observed using a field emission scanning electron microscope (FE-SEM) and measured for exposure latitude (EL) margin as a function of exposure energy and depth of focus (DoF) margin as a function of the distance from a light source. The results are shown in Table 2 of FIG. 2. The results show that the patterns showed good results in terms of profile and margins.

Comparative Example 2

The sample solution prepared in Comparative Example 1 was spin-coated on an aluminum-coated silicon wafer and baked at 240° C. for 60 seconds to form a 3,000 Å thick film.

A KrF photoresist was coated on the film, baked at 110° C. for 60 seconds, exposed to light in an exposure system (XT: 1400, NA 0.93, manufactured by ASML), and developed with an aqueous solution of TMAH (2.38 wt %) to form a 90-nm line and space pattern. The pattern was observed using a field emission scanning electron microscope (FE-SEM) and measured for exposure latitude (EL) margin as a function of exposure energy and depth of focus (DoF) margin as a function of the distance from a light source. The results are shown in Table 2. The results show that the pattern showed relatively poor results in terms of profile and margins, which are thought to be due to the difference in the absorption characteristics at a wavelength of 248 nm (KrF).

Examples 23 to 33

Each of the patterned specimens of Examples 12 to 22 was dry-etched using a gas mixture of $CHF_3/CF_4$, and further dry-etched using a gas mixture of $BCl_3/Cl_2$. Thereafter, $O_2$ plasma was used to remove all remaining organic materials. The cross sections of the specimens were observed using an FE-SEM. The results are shown in Table 3 of FIG. 3. The results show that the etched patterns all showed good profiles and high etch selectivity.

Comparative Example 3

The patterned specimen of Comparative Example 2 was dry-etched using a gas mixture of $CHF_3/CF_4$, and further dry-etched using a gas mixture of $BCl_3/Cl_2$. Thereafter, $O_2$ plasma was used to remove all remaining organic materials. The cross section of the specimen was observed using an FE-SEM. The result is shown in Table 3. The etched pattern was tapered in profile. This tapering is believed to be due to low etch selectivity under the etch conditions.

As is apparent from the above description, the anti reflective hardmask composition of an embodiment may be used to form a film having a refractive index and an absorbance suitable for use as an antireflective film in the deep UV (DUV), e.g., ArF (193 nm) and KrF (248 nm), so that the reflectivity between a resist and an underlying layer may be minimized. In addition, since the hardmask composition of an embodiment may exhibit high etch selectivity, and may be sufficiently resistant to multiple etching during lithography, it may provide a lithographic structure that has better results in terms of pattern profile and margins.

Although a number of hardmask materials are known, there is a continuous need for an improved hardmask composition. Since conventional hardmask materials may be difficult to apply to substrates, the use of, e.g., chemical and physical vapor deposition, special solvents, and/or high-temperature baking, may be required. Thus, a hardmask composition that may be applied by spin-coating techniques without the necessity of high-temperature baking may be desirable. A hardmask composition that may be selectively etched using an overlying photoresist layer as a mask while remaining resistant to the etching necessary to pattern an underlying metal layer using the hardmask layer as a mask, would also be desirable. A hardmask composition that provides superior storage properties and avoids unwanted interactions, e.g., acid pollution from the hardmask, with an imaging resist layer would also be desirable. A hardmask composition that has particular optical properties against imaging radiation at shorter wavelengths, e.g., 157 nm, 193 nm, and 248 nm, would also be desirable.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An aromatic ring-containing polymer, comprising:
at least one aromatic ring-containing polymer represented by Formulae 1, 2, or 3:

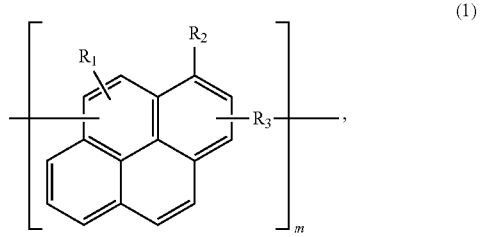

-continued

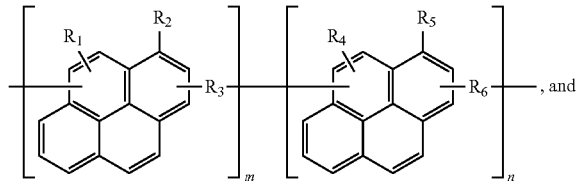
(2)

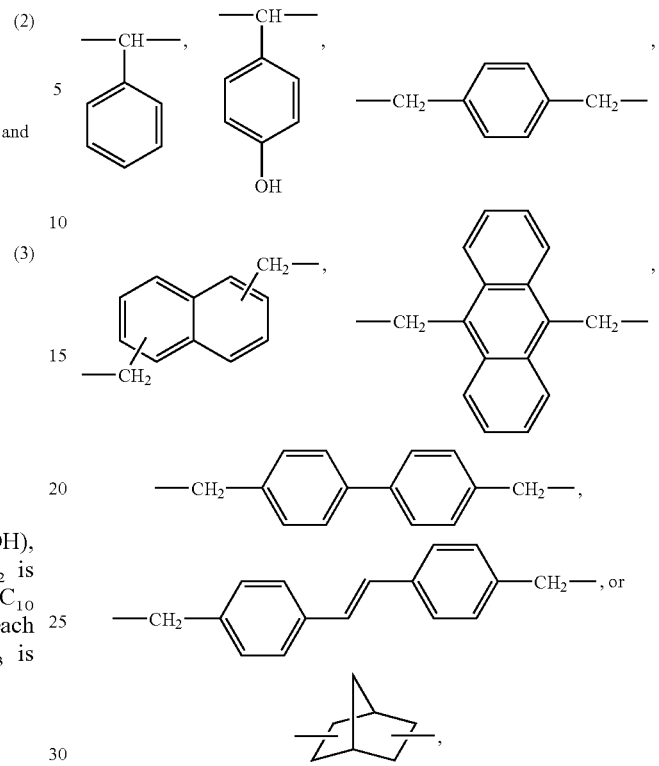

wherein in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is —CH$_2$—,

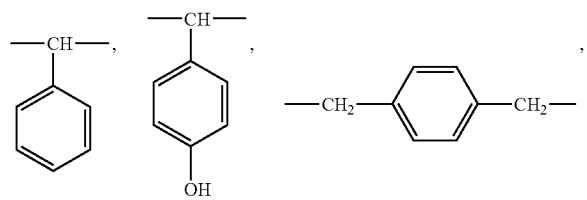

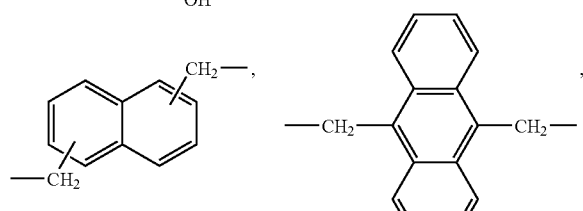

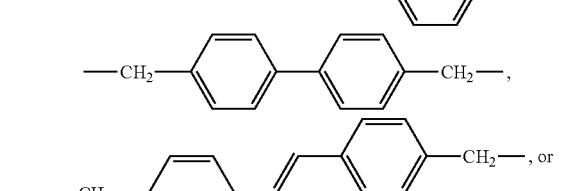

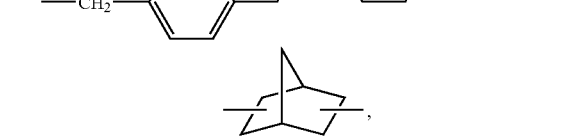

and m satisfies the relation: $1 \leq m < 190$, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —CH$_2$ and m and n satisfy the relations: $1 \leq m < 190$, $1 \leq n < 190$, and $2 \leq m+n < 190$, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$

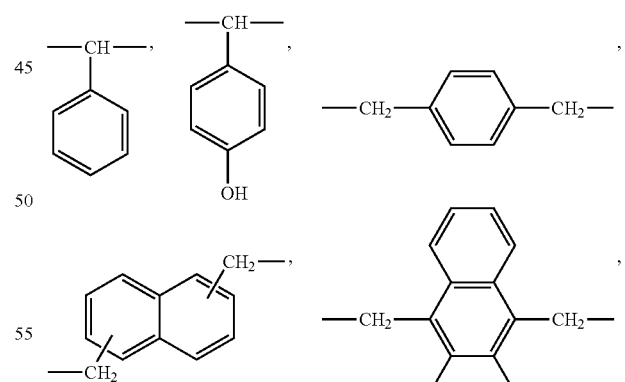

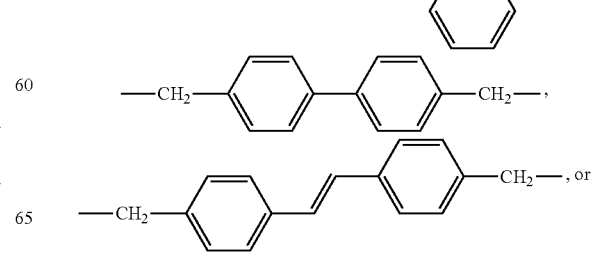

-continued

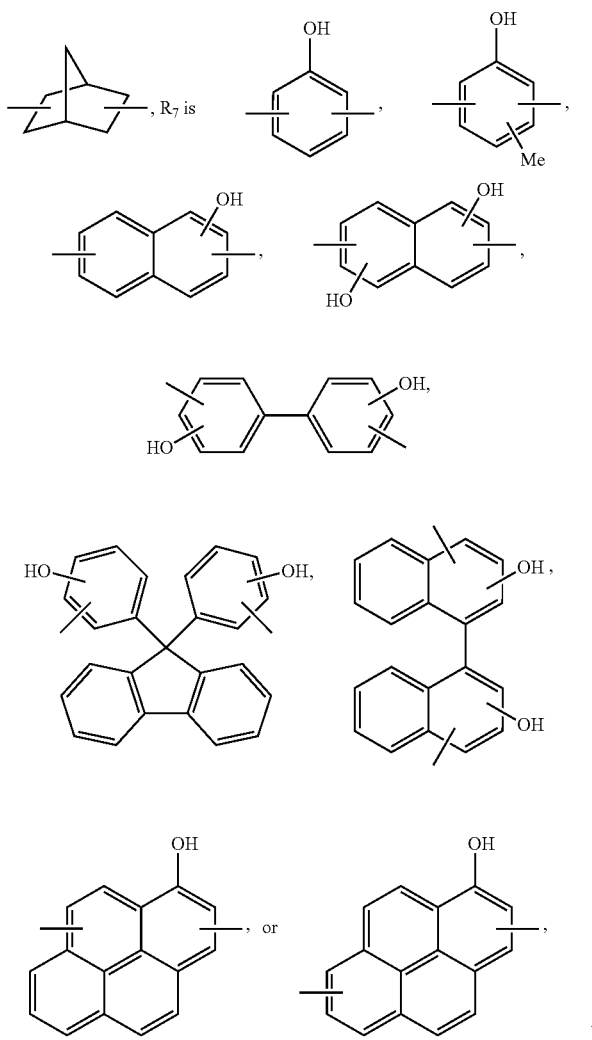

and m and o satisfy the relations: $1 \leq m < 190$, $1 \leq o < 190$, and $2 \leq m+o < 190$.

2. A polymer mixture, comprising:
about 10% to about 90% by weight of the polymer according to claim 1; and
about 10% to about 90% by weight of an aromatic ring-containing polymer represented by Formula 4:

(4)

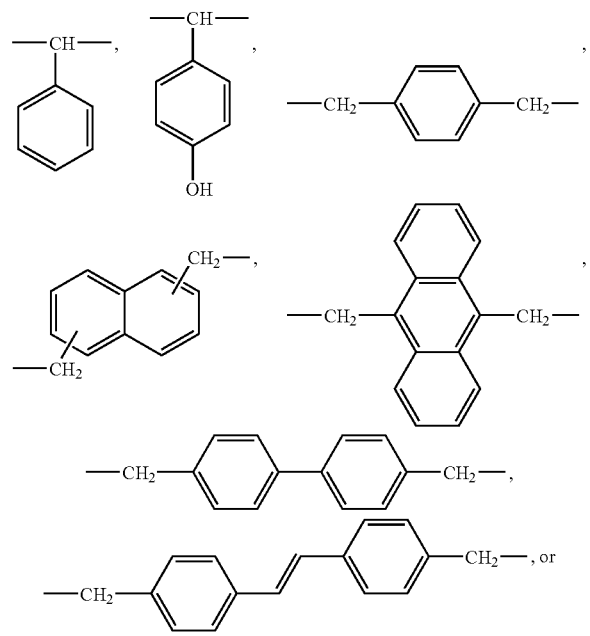

wherein, in Formula 4, p satisfies the relation: $1 \leq p < 190$.

3. An antireflective hardmask composition, comprising:
at least one aromatic ring-containing polymer represented by Formulae 1, 2, or 3:

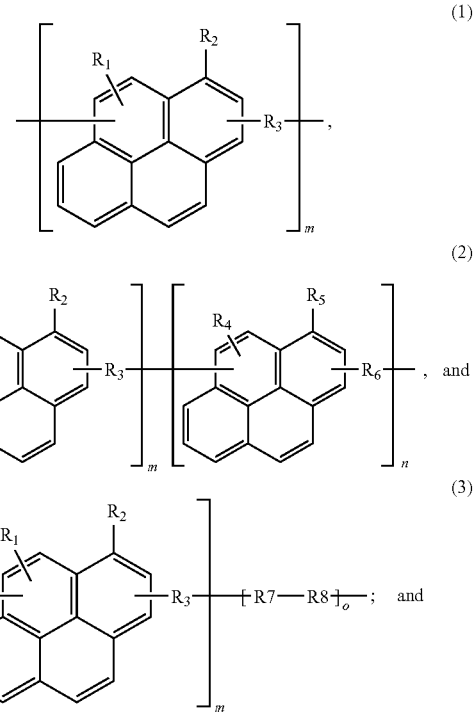

an organic solvent, wherein:
in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is —CH$_2$—,

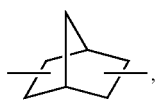

and m satisfies the relation: $1 \leqq m < 190$, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —CH$_2$

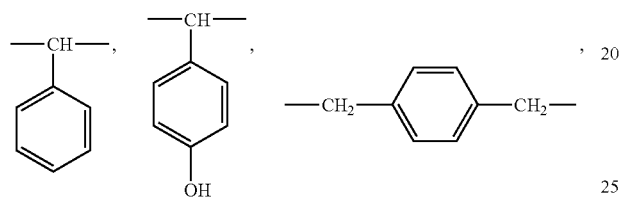

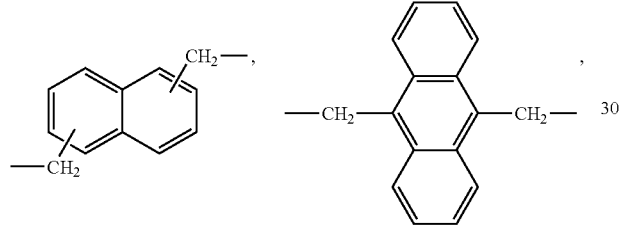

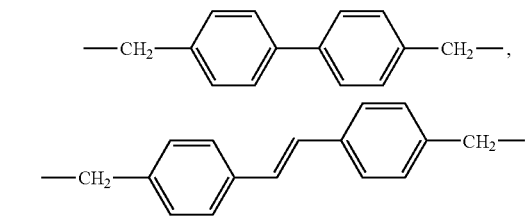

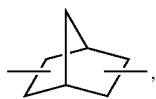

and m and n satisfy the relations: $1 \leqq m < 190$, $1 \leqq n < 190$, and $2 \leqq m+n < 190$, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$,

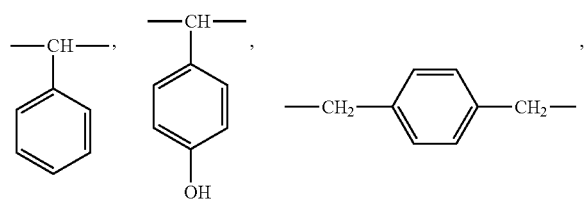

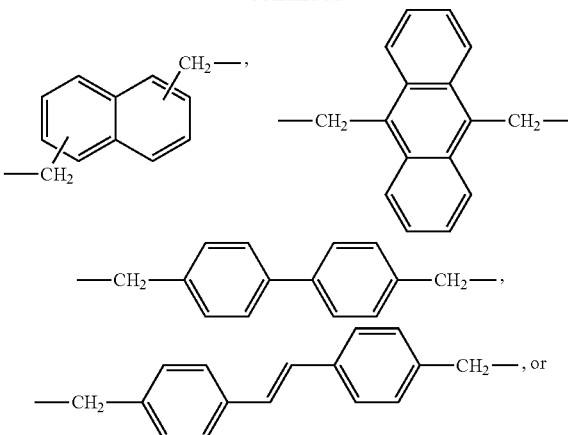

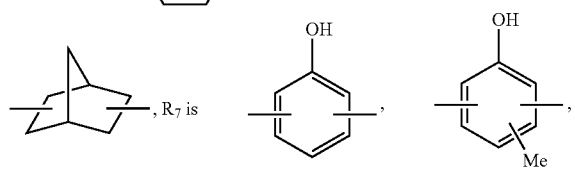

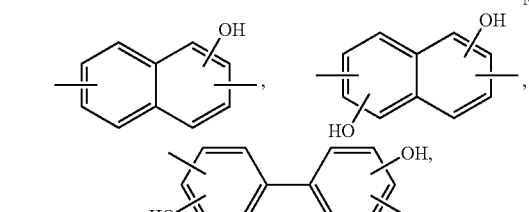

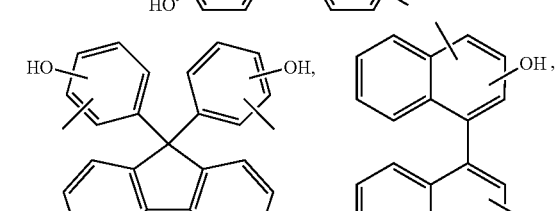

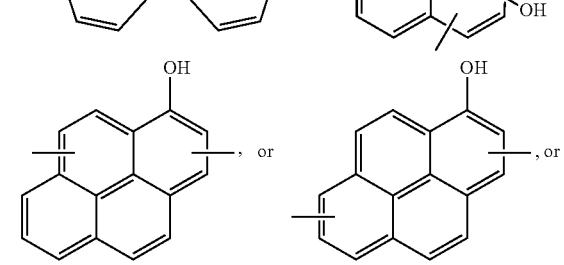

and m and o satisfy the relations: $1 \leqq m < 190$, $1 \leqq o < 190$, and $2 \leqq m+o < 190$.

4. The composition as claimed in claim 3, wherein the aromatic ring-containing polymer is present in an amount of about 1 part to about 30 parts by weight, based on 100 parts by weight of the organic solvent.

5. The composition as claimed in claim 3, further comprising a crosslinking component.

6. The composition as claimed in claim 5, wherein the crosslinking component includes at least one of melamine resins, amino resins, glycoluril compounds, and bisepoxy compounds.

7. The composition as claimed in claim 5, further comprising an acid catalyst.

8. The composition as claimed in claim 7, wherein the composition includes:

about 1% to about 20% by weight of the aromatic ring-containing polymer, about 75% to about 98.8% by weight of the organic solvent, about 0.1% to about 5% by weight of the crosslinking component, and about 0.001% to about 0.05% by weight of the acid catalyst.

9. The composition as claimed in claim 7, wherein the acid catalyst includes at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

10. The composition as claimed in claim 3, wherein the aromatic ring-containing polymer has a weight average molecular weight of about 1,000 to about 30,000.

11. The composition as claimed in claim 3, further comprising a surfactant.

12. The composition as claimed in claim 3, further comprising a polymer represented by Formula 4:

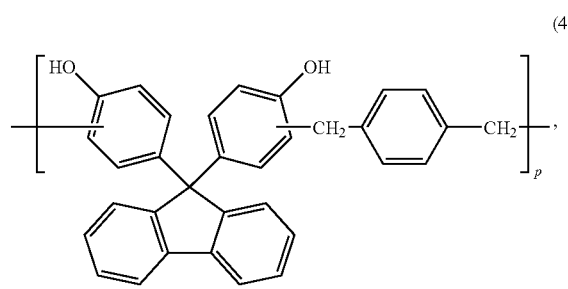

(4)

wherein, in Formula 4, p satisfies the relation: $1 \leq p < 190$.

13. The composition as claimed in claim 12, wherein the aromatic ring-containing polymer and the polymer represented by Formula 4 are included in a weight ratio of about 1:9 to about 9:1.

14. A method for patterning a material on a substrate, comprising:

providing a material layer on a substrate;

forming an antireflective hardmask layer on the material layer using an antireflective hardmask composition including at least one aromatic ring-containing polymer represented by Formulae 1, 2, or 3:

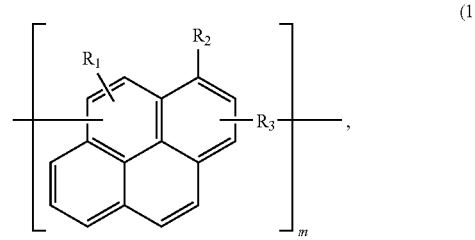

(1)

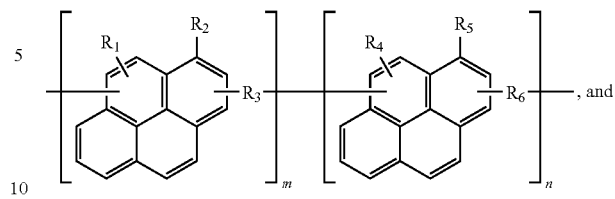

(2)

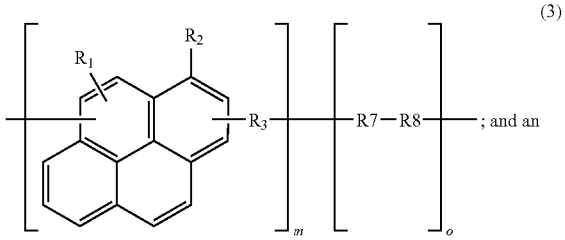

(3)

organic solvent, wherein:

in Formula 1, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—$NH_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ is -$CH_2$—,

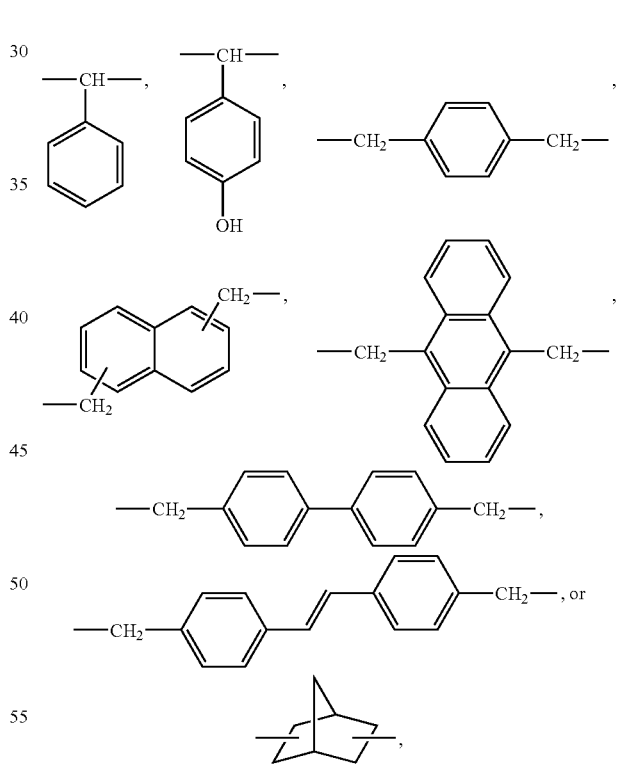

and m satisfies the relation: $1 \leq m < 190$, in Formula 2, $R_1$ and $R_4$ are each independently hydrogen, hydroxyl (—OH), $C_1$-$C_{10}$ alkyl, $C_6$-$C_{10}$ aryl, allyl, or halogen, $R_2$ and $R_5$ are each independently hydroxyl (—OH), amino (—$NH_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_6$ are each independently —$CH_2$

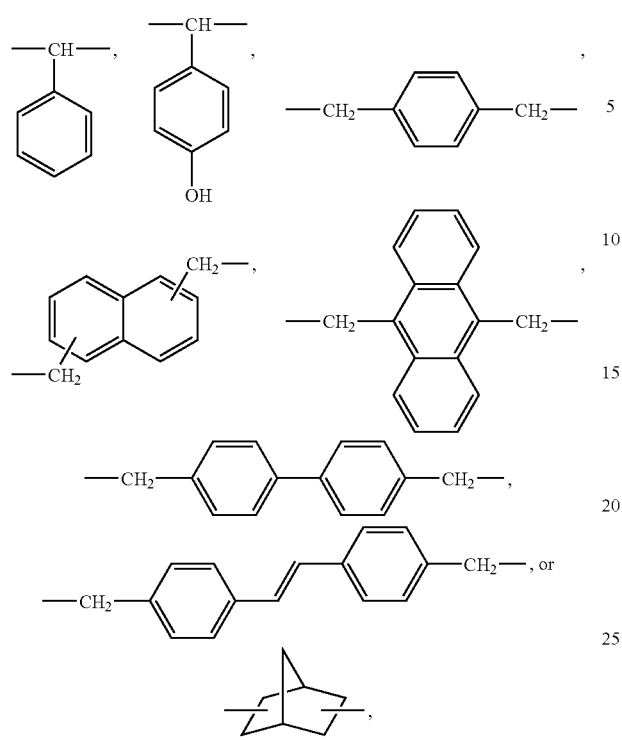

and m and n satisfy the relations: 1>m<190, 1≦n<190, and 2≦m+n<190, and in Formula 3, $R_1$ is hydrogen, hydroxyl (—OH), $C_1$-$C_{10}$ alkyl, $C_6$-$C_{10}$ aryl, allyl, or halogen, $R_2$ is hydroxyl (—OH), amino (—NH$_2$), —OR (R is $C_1$-$C_{10}$ alkyl or $C_6$-$C_{10}$ aryl), or —NRR' (R and R' are each independently $C_1$-$C_{10}$ alkyl or $C_6$-$C_{10}$ aryl), $R_3$ and $R_8$ are each independently —CH$_2$,

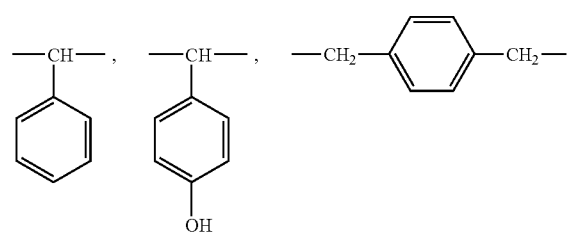

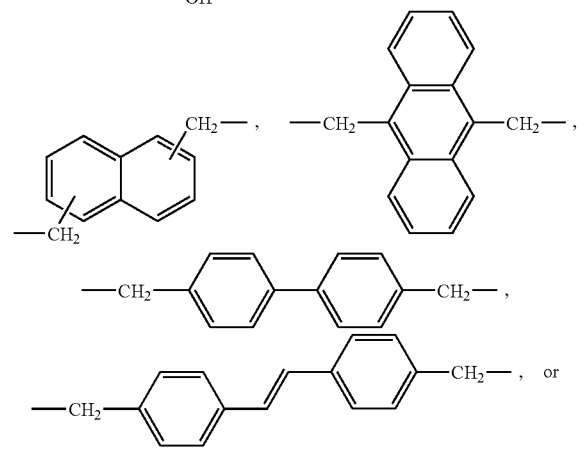

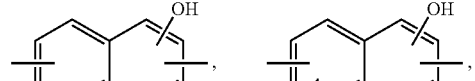

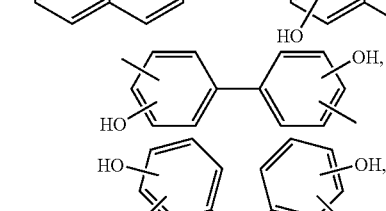

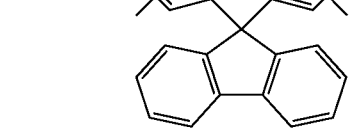

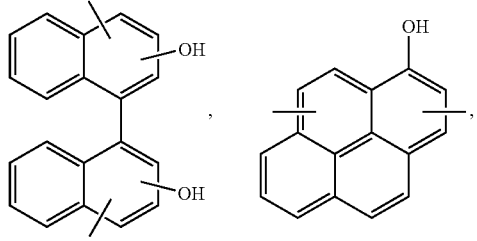

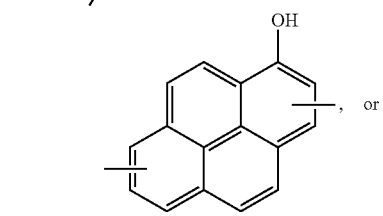

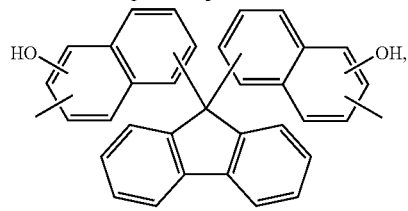

m and o satisfy the relations: 1≦m<190, 1≦o<190, and 2≦m+o<190;

forming a radiation-sensitive imaging layer on the antireflective hardmask layer;

patternwise exposing the radiation-sensitive imaging layer to radiation to form a pattern of radiation-exposed regions in the imaging layer;

selectively removing portions of the radiation-sensitive imaging layer and the antireflective hardmask layer to expose portions of the material layer; and etching the exposed portions of the material layer to pattern the material layer.

15. The method as claimed in claim 14, further comprising forming a silicon-containing hardmask layer prior to forming the radiation-sensitive imaging layer.

16. The method as claimed in claim 15, further comprising the step of forming a bottom antireflective coating (BARC) on the silicon-containing hardmask layer prior to forming the radiation-sensitive imaging layer.

17. The method as claimed in claim 14, wherein the anti-reflective hardmask composition further includes a polymer represented by Formula 4:
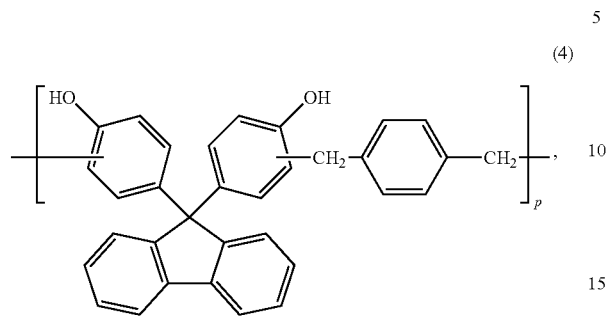
(4)
wherein, in Formula 4, p satisfies the relation: $1 \leqq p < 190$.
* * * * *